(12) United States Patent
Chen et al.

(10) Patent No.: US 12,080,702 B2
(45) Date of Patent: *Sep. 3, 2024

(54) METHOD OF FABRICATING PACKAGE STRUCTURE

(71) Applicant: Taiwan Semiconductor Manufacturing Company, Ltd., Hsinchu (TW)

(72) Inventors: Hsien-Wei Chen, Hsinchu (TW); Jie Chen, New Taipei (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 31 days.

This patent is subject to a terminal disclaimer.

(21) Appl. No.: 17/873,073

(22) Filed: Jul. 25, 2022

(65) Prior Publication Data

US 2022/0359490 A1 Nov. 10, 2022

Related U.S. Application Data

(63) Continuation of application No. 16/882,759, filed on May 26, 2020, now Pat. No. 11,557,581.

(Continued)

(51) Int. Cl.
*H01L 25/065* (2023.01)
*H01L 21/56* (2006.01)
(Continued)

(52) U.S. Cl.
CPC .............. *H01L 25/50* (2013.01); *H01L 21/56* (2013.01); *H01L 24/06* (2013.01); *H01L 24/80* (2013.01);
(Continued)

(58) Field of Classification Search
CPC ....... H01L 25/0657; H01L 2224/06181; H01L 2224/80001; H01L 21/76898; H01L 24/08;
(Continued)

(56) References Cited

U.S. PATENT DOCUMENTS 9,000,584 B2 4/2015 Lin et al.
9,048,222 B2 6/2015 Hung et al.
(Continued)

*Primary Examiner* — Kyoung Lee
*Assistant Examiner* — Christina A Sylvia
(74) *Attorney, Agent, or Firm* — JCIPRNET

(57) ABSTRACT

A method is provided. A bottom tier package structure is bonded to a support substrate through a first bonding structure, wherein the bottom tier package structure includes a first semiconductor die encapsulated by a first insulating encapsulation, and the first bonding structure includes stacked first dielectric layers and at least one stacked first conductive features penetrating through the stacked first dielectric layers. The support substrate is placed on a grounded stage such that the first semiconductor die is grounded through the at least one first stacked conductive features, the support substrate and the grounded stage. A second semiconductor die is bonded to the bottom tier package structure through a second bonding structure, wherein the second bonding structure includes stacked second dielectric layers and at least one stacked second conductive features penetrating through the stacked second dielectric layers. The second semiconductor die is encapsulated with a second insulating encapsulation.

20 Claims, 18 Drawing Sheets

Related U.S. Application Data

(60) Provisional application No. 62/904,625, filed on Sep. 23, 2019.

(51) Int. Cl.
 *H01L 23/00* (2006.01)
 *H01L 25/00* (2006.01)

(52) U.S. Cl.
 CPC .............. *H01L 24/96* (2013.01); *H01L 24/97* (2013.01); *H01L 25/0657* (2013.01); *H01L 2224/06181* (2013.01); *H01L 2224/80001* (2013.01)

(58) Field of Classification Search
 CPC ........... H01L 24/19; H01L 2224/05647; H01L 21/568; H01L 24/92; H01L 2221/68327; H01L 2221/68345; H01L 2221/68354; H01L 2221/68368; H01L 2224/08145; H01L 2224/09181; H01L 2224/73251; H01L 2224/80006; H01L 2224/80357; H01L 2224/80379; H01L 2224/9222; H01L 2224/94; H01L 2224/95; H01L 2224/96; H01L 2225/06524; H01L 2225/06527; H01L 2225/06541; H01L 2225/06548; H01L 2225/06586; H01L 21/6835; H01L 24/83; H01L 23/4824; H01L 23/49822; H01L 24/03; H01L 2224/0231; H01L 2224/02331; H01L 2224/02381

See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2015/0228550 A1* | 8/2015 | Yu ........................... H01L 22/20 257/48 |
| 2015/0303174 A1* | 10/2015 | Yu ........................... H01L 24/19 438/109 |
| 2016/0233192 A1* | 8/2016 | Dosluoglu ........ H01L 23/49822 |

* cited by examiner

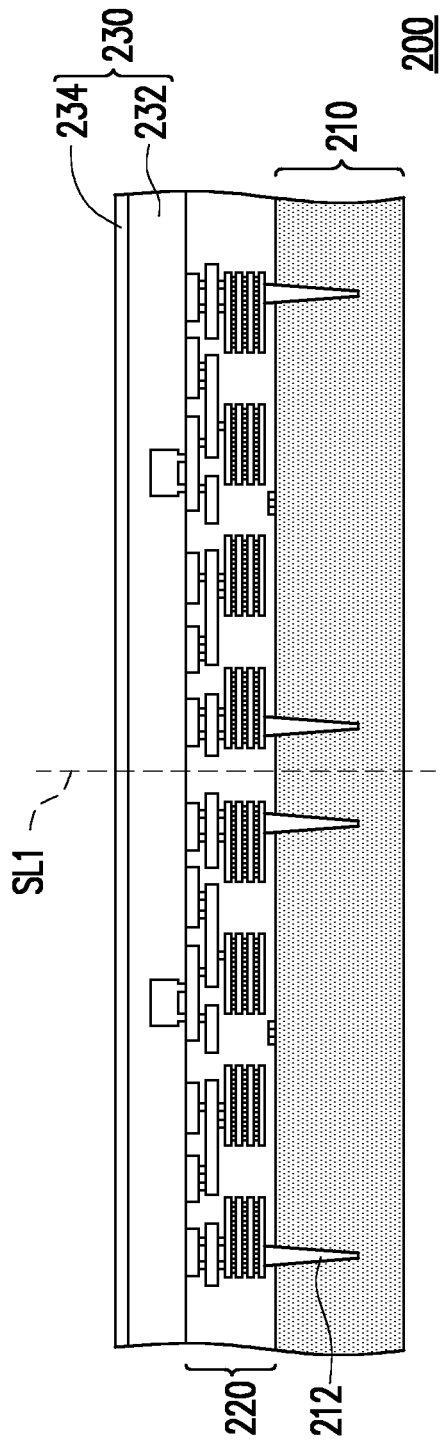
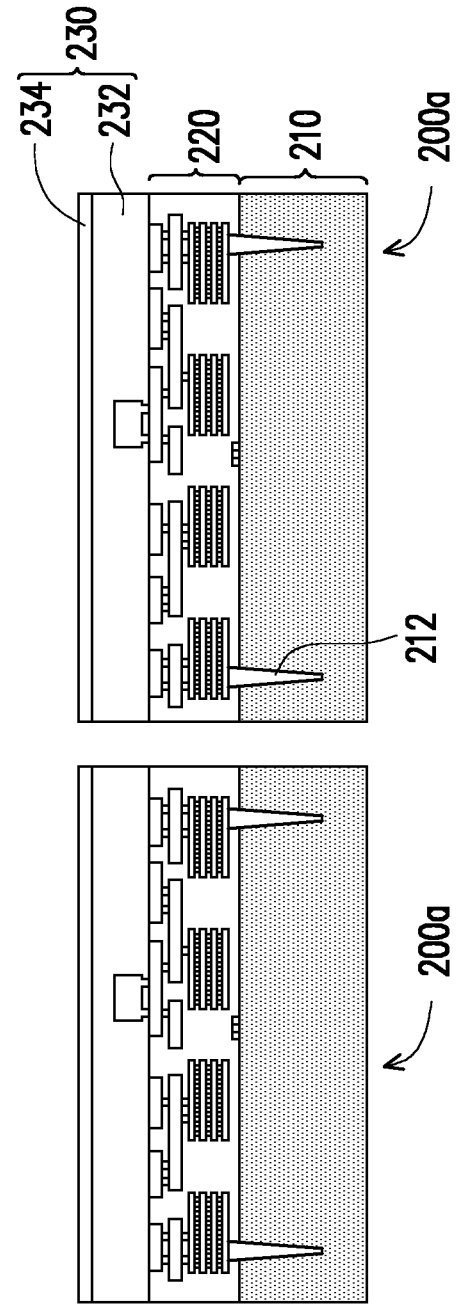

METHOD OF FABRICATING PACKAGE STRUCTURE

CROSS-REFERENCE TO RELATED APPLICATION

This is a continuation application of and claims the priority benefit of U.S. application Ser. No. 16/882,759, filed on May 26, 2020, now allowed. This U.S. application Ser. No. 16/882,759 claims the priority benefit of U.S. provisional application Ser. No. 62/904,625, filed on Sep. 23, 2019. The entirety of the above-mentioned patent applications is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A through FIG. 2D are cross-sectional views schematically illustrating a process flow for fabricating a reconstructed wafer including bottom tier package structures in accordance with some embodiments of the present disclosure.

DETAILED DESCRIPTION

Figure 1A:
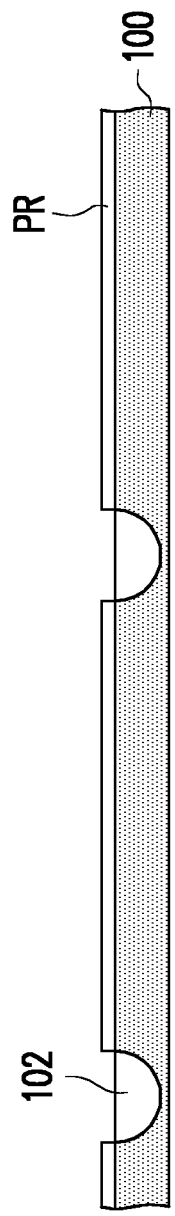
FIG. 1A through FIG. 1C are cross-sectional views schematically illustrating a process flow for fabricating a support substrate in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In some embodiments, the SoIC chip packages are fabricated over a support substrate or a support wafer which is mounted on a grounded stage to minimize metal corrosion issue of the conductive features resulted from chemicals (e.g. a CMP slurry) used in a CMP process.

Preparation of Support Substrate

Figure 1B:
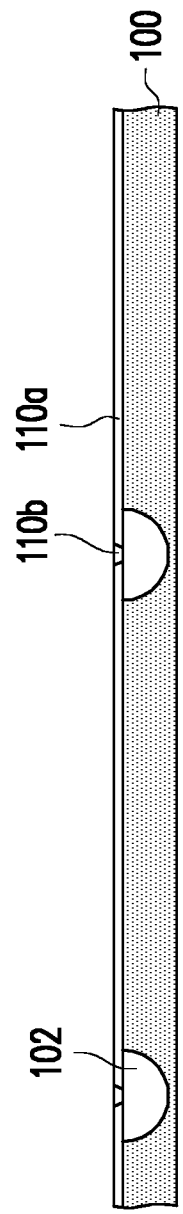
Figure 1C:
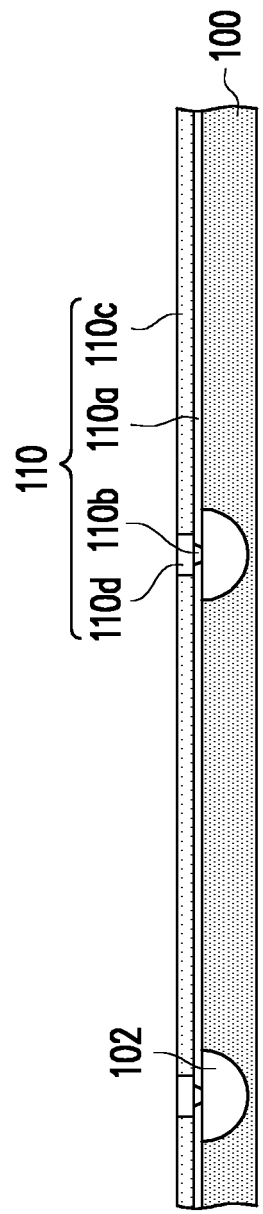

FIG. 1A through FIG. 1C are cross-sectional views schematically illustrating a process flow for fabricating a support substrate in accordance with some embodiments of the present disclosure.

Referring to FIG. 1A, a support substrate 100 is provided. In some embodiments, the support substrate 100 includes a semiconductor substrate in wafer form (e.g., a silicon wafer). A patterned photoresist layer PR including openings may be formed over the support substrate 100 to partially cover the top surface of the support substrate 100, wherein a top surface of the support substrate 100 is partially exposed by the openings defined in the patterned photoresist layer PR. An ion implantation process may be performed by using the patterned photoresist layer PR as an implantation mask such that doped regions 102 may be formed in the support substrate 100. After performing the ion implantation process, an annealing process may be performed to drive implanted dopants to diffuse in the support substrate 100. In some embodiments, the doped regions 102 are heavily doped and extend from the top surface of the support substrate 100 to a bottom surface of the support substrate 100. In some embodiments, the doped regions 102 include n-type doped regions, p-type doped regions or combinations thereof. The doping concentration of the doped regions 102 may range from about 1E9 cm-3 to about 1E16 cm-3.

As illustrated in FIG. 1A, the doped regions 102 are locally distributed in the support substrate 100. In other words, the doped regions 102 are distributed in the support substrate 100 and spaced apart from one another. The distribution of the doped regions 102 in the support substrate 100 may be modified based on design requirements. In some other embodiments, an ion implantation process may be performed without using implantation mask such that the support substrate 100 may be entirely doped. In some alternative embodiments, the support substrate 100 is a conductive substrate, such as a metal substrate, an insulating substrate having conductive feature penetrating therethrough, or the like.

Referring to FIG. 1A and FIG. 1B, after the doped regions 102 are formed in the support substrate 100, the patterned photoresist layer PR is removed such that the top surface of the support substrate 100 is exposed. A bottom dielectric layer 110a and bottom conductive features 110b penetrating through the bottom dielectric layer 110a may be formed over the top surface of the support substrate 100. As illustrated in FIG. 1B, a top surface of the bottom dielectric layer 110a may be substantially coplanar with top surfaces of the bottom conductive features 110b. Furthermore, the bottom conductive features 110b are disposed over and electrically connected to the doped regions 102 of the support substrate 100.

A dielectric material is deposited over the top surface of the support substrate 100 and patterned by, for example, photolithography and etch processes such that the bottom dielectric layer 110a including openings defined therein is formed over the top surface of the support substrate 100. The dielectric material may be formed by physical vapor deposition (PVD), chemical vapor deposition (CVD) or other suitable processes. The openings in the bottom dielectric layer 110a are located above the doped regions 102 of the support substrate 100. A conductive material is then deposited over the support substrate 100 to cover the bottom dielectric layer 110a and fill the openings defined in the bottom dielectric layer 110a. Portions of the conductive material which fill the openings are in contact with the doped regions 102 of the support substrate 100. The conductive material may be formed by physical vapor deposition (PVD), chemical vapor deposition (CVD) or other suitable processes. A removal process may be performed to partially remove the deposited conductive material until the bottom dielectric layer 110a is exposed such that the bottom conductive features 110b embedded in and penetrating through the bottom dielectric layer 110a are formed over the support substrate 100. The deposited conductive material for forming the bottom conductive features 110b may be partially removed by an etching process, a mechanical grinding process, a chemical mechanical polishing (CMP) process, or other suitable removal processes, or combinations thereof. In some embodiments, a seed layer is formed over the support substrate 100 and the bottom dielectric layer 110a through a sputter process, a conductive material is formed over the seed layer through an electro-plating process, and a CMP process is then performed to remove the conductive material and the seed layer outside the openings of the bottom dielectric layer 110a to form the bottom conductive features 110b.

Referring to FIG. 1C, after the bottom dielectric layer 110a and the bottom conductive features 110b are formed over the support substrate 100, a bottom dielectric layer 110c and bottom conductive features 110d penetrating through the bottom dielectric layer 110c may be formed to cover the bottom dielectric layer 110a and the bottom conductive features 110b. As illustrated in 1C, a top surface of the bottom dielectric layer 110c may be substantially coplanar with top surfaces of the bottom conductive features 110d. Furthermore, the bottom conductive features 110d are disposed over and electrically connected to the doped regions 102 of the support substrate 100 through the bottom conductive features 110b. In some embodiments, the lateral dimension (e.g. width) of the bottom conductive features 110d is greater than that of the bottom conductive features 110b. In some other embodiments, not illustrated in FIG. 1C, the lateral dimension (e.g. width) of the bottom conductive features 110d is less than or substantially equal to that of the bottom conductive features 110b.

A dielectric material may be deposited over the bottom dielectric layer 110a and the bottom conductive features 110b and patterned by, for example, photolithography and etch processes such that the bottom dielectric layer 110c including openings defined therein is formed over the bottom dielectric layer 110a and the bottom conductive features 110b. The dielectric material may be formed by physical vapor deposition (PVD), chemical vapor deposition (CVD) or other suitable processes. The openings in the bottom dielectric layer 110c are located above the bottom conductive features 110b and the doped regions 102 of the support substrate 100. A conductive material is then deposited over the bottom dielectric layer 110c and the bottom conductive features 110d to fill the openings defined in the bottom dielectric layer 110c. Portions of the conductive material which fill the openings are in contact with the bottom conductive features 110b. The conductive material may be formed by physical vapor deposition (PVD), chemical vapor deposition (CVD) or other suitable processes. A removal process may be performed to partially remove the deposited conductive material until the bottom dielectric layer 110c is exposed such that the bottom conductive features 110d embedded in and penetrating through the bottom dielectric layer 110c are formed. The deposited conductive material for forming the bottom conductive features 110d may be partially removed by an etching process, a mechanical grinding process, a CMP process, or other suitable removal processes, or combinations thereof. In some embodiments, a seed layer is formed over the bottom dielectric layer 110, the bottom conductive features 110b, and the bottom dielectric layer 110c through a sputter process, a conductive material is formed over the seed layer through an electro-plating process, and a CMP process is then performed to remove the conductive material and the seed layer outside the openings of the bottom dielectric layer 110c to form the bottom conductive features 110d.

In some embodiments, the material of the bottom conductive features 110b and 110d include copper (Cu) or other suitable metallic materials, and the material of the bottom dielectric layer 110a and 110c include silicon oxide ($SiO_x$, where x>0), silicon nitride ($SiN_x$, where x>0), silicon oxynitirde ($SiO_xN_y$, where x>0 and y>0) or other suitable dielectric materials.

As illustrated in FIG. 1C, a bonding portion 110 including the bottom dielectric layer 110a, the bottom conductive features 110b, the bottom dielectric layer 110c, and the bottom conductive features 110d is formed over the top surface of the support substrate 100. Although two bottom dielectric layers 110a and 110c are illustrated and included in the bonding portion 110, the number of dielectric layers and conductive features included in the bonding portion 110 is not limited in the present invention.

Fabrication of Bottom Tier Package Structure

FIG. 2A through FIG. 2D are cross-sectional views schematically illustrating a process flow for fabricating a reconstructed wafer including bottom tier package structures in accordance with some embodiments of the present disclosure.

Referring to FIG. 2A, a semiconductor wafer 200 is provided. The semiconductor wafer 200 may include a semiconductor substrate 210, an interconnect structure 220 over the semiconductor substrate 210, and a bonding portion 230 over the interconnect structure 220. The semiconductor wafer 200 may further include through semiconductor vias (TSVs) 212 electrically connected to the interconnect structure 220. The TSVs 212 may be formed in the semiconductor substrate 210 and the interconnect structure 220. The semiconductor substrate 210 may be a bulk silicon substrate, a silicon-on-insulator (SOI) substrate or a germanium-on-insulator (GOI) substrate. The semiconductor substrate 210 may include other suitable semiconductor materials. In some embodiments, the semiconductor substrate 210 may include other conductive layers or other semiconductor elements, such as transistors, diodes, resistors, capacitors or the like. The interconnection structure 220 is electrically connected to the conductive layers or other semiconductor elements formed in the semiconductor substrate 210. The bonding portion 230 may include a planarization layer 232 and a bonding layer 234. The material of the planarization layer 232 and the material of the bonding layer 234 may include silicon oxide ($SiO_x$, where x>0), silicon nitride ($SiN_x$, where x>0), silicon oxynitirde ($SiO_xN_y$, where x>0 and y>0) or other suitable dielectric materials. The material of the planarization layer 232 may be different from or the same as that of the bonding layer 234.

Referring to FIG. 2A and FIG. 2B, a wafer dicing process is performed along the scribe line SL1 to singulate the semiconductor wafer 200. The semiconductor wafer 200 is singulated into first semiconductor dies 200a. As illustrated in FIG. 2B, each singulated first semiconductor dies 200a may include a semiconductor substrate 210, an interconnect structure 220 over the semiconductor substrate 210, and a bonding portion 230 over the interconnect structure 220.

Figure 2C:
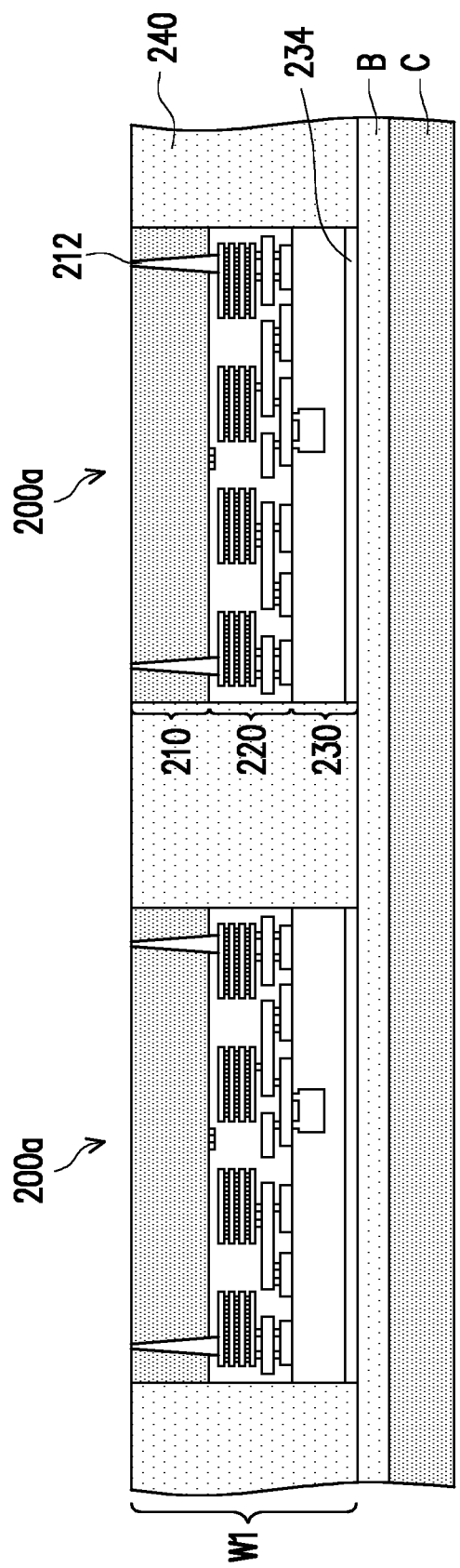

Referring to FIG. 2C, a carrier C having a bonding layer B formed thereon is provided. The singulated first semiconductor dies 200a are picked-up and placed on the bonding layer B carried by the carrier C. After the first semiconductor dies 200a are picked-up and placed on the bonding layer B, the first semiconductor dies 200a are flipped over the bonding layer B such that the bonding layer 234 of the first semiconductor dies 200a is in contact with the bonding layer B. A dielectric-to-dielectric bonding process (e.g., an oxide-to-oxide bonding) may be performed to bond the bonding layer 234 to the bonding layer B carried by the carrier C. In some embodiments, the material of the bonding layer 234 is the same as that of the bonding layer B. In some other embodiments, the material of the bonding layer 234 is different from that of the bonding layer B.

After the first semiconductor dies 200a are bonded to the bonding layer B, an insulating encapsulation 240 is formed over the bonding layer B to laterally encapsulate the first semiconductor dies 200a. The insulating encapsulation 240 may be formed by an over-molding or deposition process followed by a grinding process. In some embodiments, the material of the insulating encapsulation 240 includes deposited polyimide, deposited oxide, deposited nitride, or other suitable deposited dielectric material. In some alternative embodiments, the material of the insulating encapsulation 240 includes epoxy or other suitable molding compound. In some embodiments, an insulating material is formed over the bonding layer B through an over-mold process to cover side surfaces and bottom surfaces of the first semiconductor dies 200a, and the insulating material is then polished by, for example, a mechanical grinding process and/or a CMP process such that the insulating encapsulation 240 are formed and the bottom surfaces of the first semiconductor dies 200a are revealed. During the grinding process of the insulating material, the semiconductor substrates 210 of the first semiconductor dies 200a are polished and thinned down such that bottom surfaces of the TSVs 212 are revealed.

As illustrated in FIG. 2C, after performing the grinding process of the insulating material, a reconstructed wafer W1 is formed. The reconstructed wafer W1 may include the first semiconductor dies 200a arranged in array and the insulating encapsulation 240 laterally encapsulating the first semiconductor dies 200a. After forming the insulating encapsulation 240, the reconstructed wafer W1 including bottom tier package structures arranged in array is fabricated.

Figure 2D:
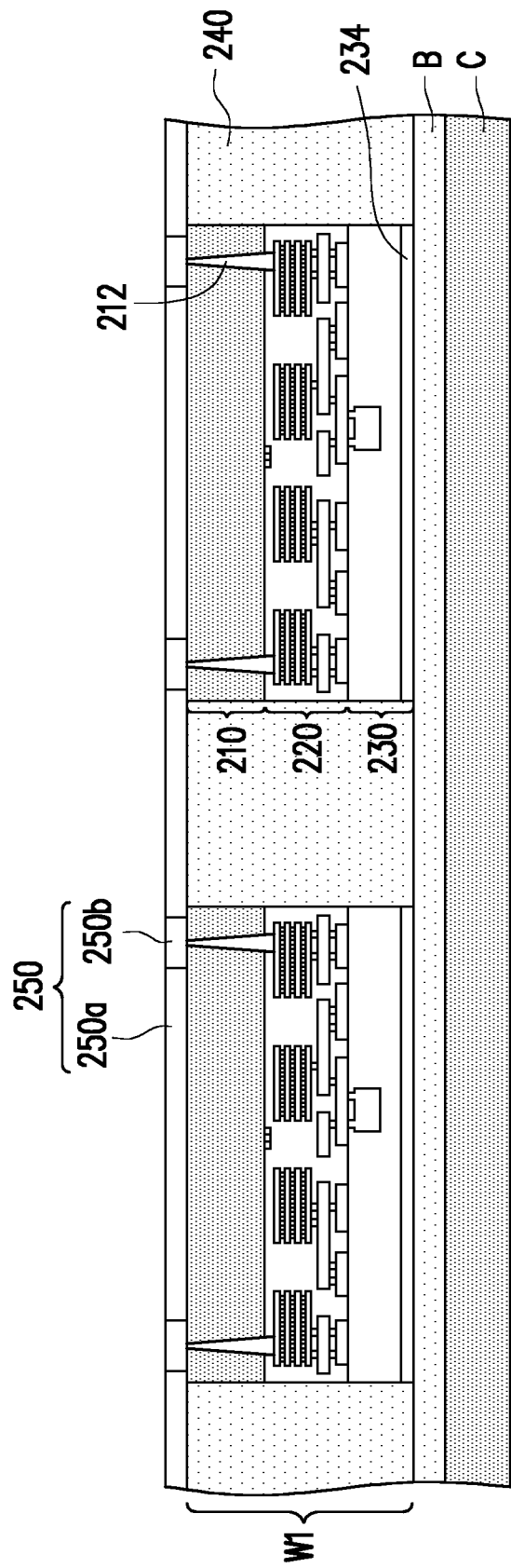

Referring to FIG. 2D, a bonding portion 250 including an upper dielectric layer 250a and upper conductive features 250b penetrating through the upper dielectric layer 250a is formed over a surface of the reconstructed wafer W1. Although one upper dielectric layer 250a is illustrated and included in the bonding portion 250, the number of dielectric layers and conductive features included in the bonding portion 250 is not limited in the present invention. The material of the upper dielectric layer 250a may include silicon oxide ($SiO_x$, where x>0), silicon nitride ($SiN_x$, where x>0), silicon oxynitirde ($SiO_xN_y$, where x>0 and y>0) or other suitable dielectric materials. The material of the upper conductive features 250b may include copper (Cu) or other suitable metallic materials. As illustrated in FIG. 2D, a top surface of the upper dielectric layer 250a may be substantially coplanar with top surfaces of the upper conductive features 250b.

A dielectric material is deposited over the surface of the reconstructed wafer W1 and patterned by, for example, photolithography and etch processes such that the upper dielectric layer 250a including openings defined therein is formed over the surface of the reconstructed wafer W1. The dielectric material may be formed by physical vapor deposition (PVD), chemical vapor deposition (CVD) or other suitable processes. The openings in the upper dielectric layer 250a are located above the TSVs 212 of the first semiconductor dies 200a. A conductive material is then deposited over the reconstructed wafer W1 to cover the upper dielectric layer 250a and fill the openings defined in the upper dielectric layer 250a. Portions of the conductive material which fill the openings are in contact with the TSVs 212 of the first semiconductor dies 200a. The conductive material may be formed by physical vapor deposition (PVD), chemical vapor deposition (CVD) or other suitable processes. A removal process may be performed to partially remove the deposited conductive material until the upper dielectric layer 250a is exposed such that the upper conductive features 250b embedded in and penetrating through the upper dielectric layer 250a are formed over the reconstructed wafer W1. The deposited conductive material for forming the upper conductive features 250b may be partially removed by an etching process, a mechanical grinding process, a CMP process, or other suitable removal processes, or combinations thereof. In some embodiments, a seed layer is formed over the reconstructed wafer W1 and the upper dielectric layer 250a through a sputter process, a conductive material is formed over the seed layer through an electro-plating process, and a CMP process is then performed to remove the conductive material and the seed layer outside the openings of the upper dielectric layer 250a to form the upper conductive features 250b.

Fabrication of Top Semiconductor Dies

Figure 3A:
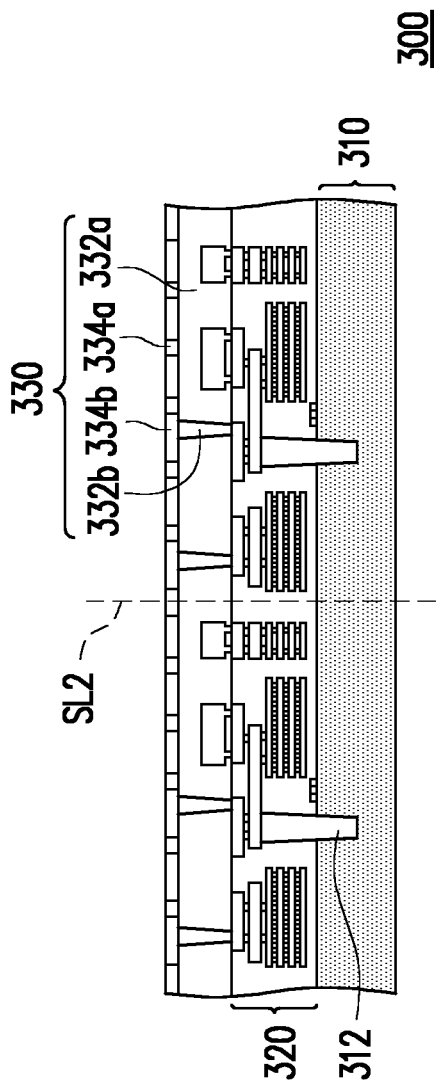
FIG. 3A and FIG. 3B are cross-sectional views schematically illustrating a process flow for fabricating top semiconductor dies in accordance with some embodiments of the present disclosure.
Figure 3B:
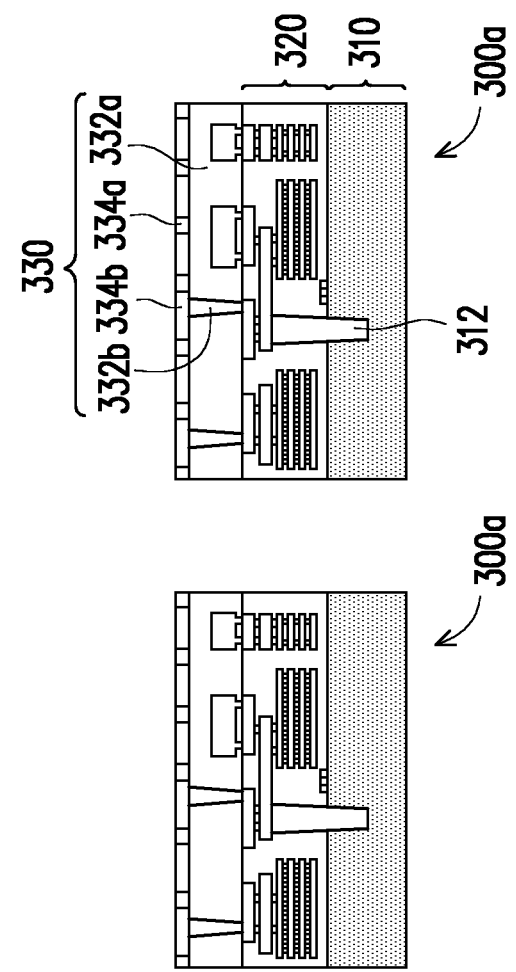

FIG. 3A and FIG. 3B are cross-sectional views schematically illustrating a process flow for fabricating top semiconductor dies in accordance with some embodiments of the present disclosure.

Referring to FIG. 3A, a semiconductor wafer 300 is provided. The semiconductor wafer 300 may include a semiconductor substrate 310, an interconnect structure 320 over the semiconductor substrate 310, and a bonding portion 330 over the interconnect structure 320. The semiconductor wafer 300 may further include through semiconductor vias (TSVs) 312 electrically connected to the interconnect structure 320. The TSVs 312 may be formed in the semiconductor substrate 310 and the interconnect structure 320. The semiconductor substrate 310 may be a bulk silicon substrate, a silicon-on-insulator (SOI) substrate or a germanium-on-insulator (GOI) substrate. The semiconductor substrate 310 may include other suitable semiconductor materials. In some embodiments, the semiconductor substrate 310 may include other conductive layers or other semiconductor elements, such as transistors, diodes, resistors, capacitors or the like. The interconnection structure 320 is electrically connected to the conductive layers or other semiconductor elements formed in the semiconductor substrate 310. The bonding portion 330 may include a planarization layer 332a, conductive features 332b penetrating through the planarization layer 332a, an upper dielectric layer 334a, and upper conductive features 334b penetrating through the upper dielectric layer 334a. The upper conductive features 332b may be conductive vias electrically connected between the interconnection structure 320 and the upper conductive features 334b, and the upper conductive features 334b may be bonding pads. The material of the planarization layer 332a may include silicon oxide ($SiO_x$, where x>0), silicon nitride ($SiN_x$, where x>0), silicon oxynitirde ($SiO_xN_y$, where x>0 and y>0) or other suitable dielectric materials. The material of the upper dielectric layer 334a may include silicon oxide ($SiO_x$, where x>0), silicon nitride ($SiN_x$, where x>0), silicon oxynitirde ($SiO_xN_y$, where x>0 and y>0) or other suitable dielectric materials. The material of the planarization layer 332a may be different from or the same as that of the upper dielectric layer 334a. The material of the upper conductive features 332b and 334b may include copper (Cu) or other suitable metallic materials.

Referring to FIG. 3A and FIG. 3B, a wafer dicing process is performed along the scribe line SL2 to singulate the semiconductor wafer 300. The semiconductor wafer 300 is singulated into second semiconductor dies 300a. As illustrated in FIG. 3B, each singulated second semiconductor dies 300a may include a semiconductor substrate 310, an interconnect structure 320 over the semiconductor substrate 310, and a bonding portion 330 over the interconnect structure 320.

Fabrication of Package Structure

FIG. 4A through FIG. 4G are cross-sectional views schematically illustrating a process flow for fabricating a package structure of system on an integrated circuit (SoIC) chip in accordance with some embodiments of the present disclosure.

Figure 4A:
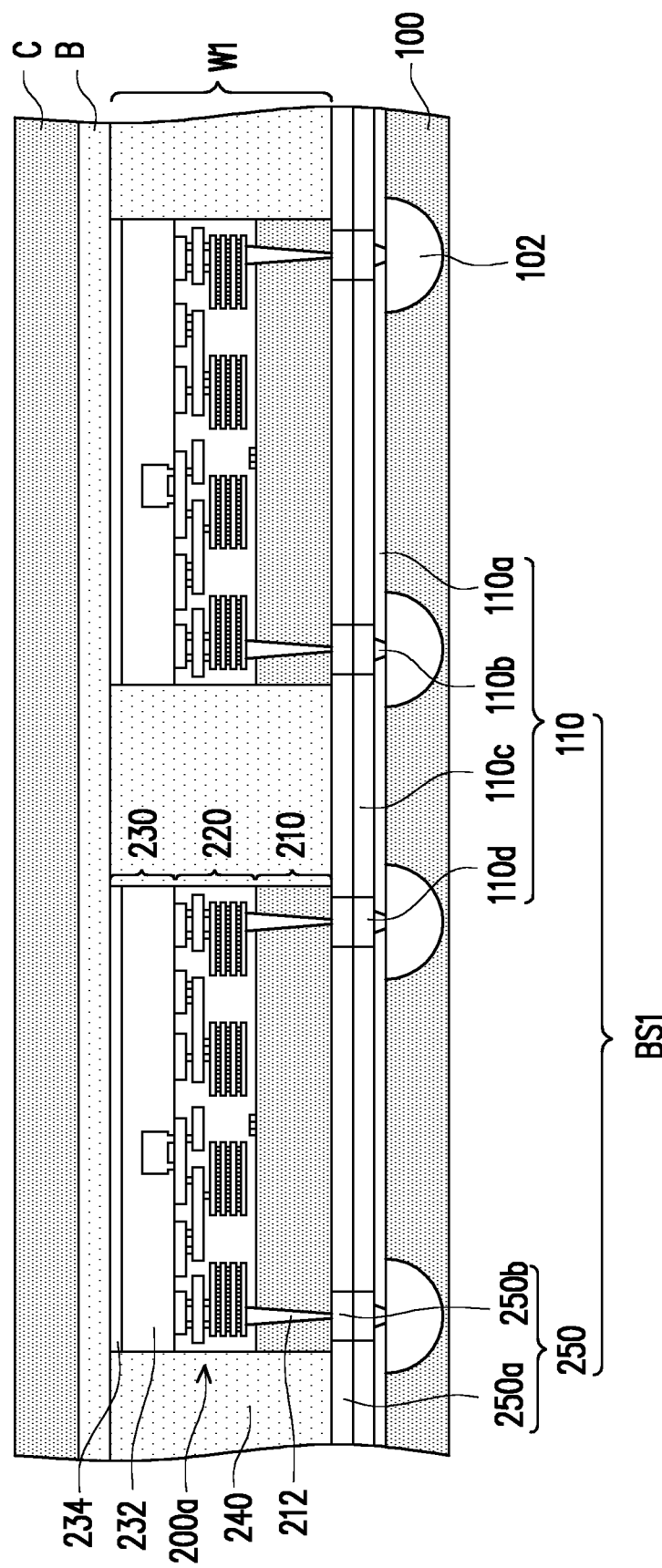
FIG. 4A through FIG. 4G are cross-sectional views schematically illustrating a process flow for fabricating a package structure of system on an integrated circuit (SoIC) chip in accordance with some embodiments of the present disclosure.

Referring to FIG. 4A, the support wafer 100 including the bonding portion 110 formed thereon (illustrated in FIG. 1C) and the reconstructed wafer W1 bonded to the carrier C though the bonding layer B (illustrated in FIG. 2D) are provided. The reconstructed wafer W1 are flipped over and pressed onto the bonding portion 110 formed on the support wafer 100 such that the bonding portion 250 is in contact with the bonding portion 110. A wafer-to-wafer bonding process (e.g., a wafer-to-wafer hybrid bonding process including dielectric-to-dielectric bonding and metal-to-metal bonding) is performed to bond the reconstructed wafer W1 to the support wafer 100 through a first bonding structure BS1 including the bonding portion 110 and the bonding portion 250. In the first bonding structure BS1, the bonding portion 110 serves as a bottom bonding portion, and the bonding portion 250 serves an upper bonding portion. As illustrated in FIG. 4A, the first bonding structure BS1 includes stacked first dielectric layers 110a, 110c and 250a and stacked first conductive features 110b, 110d and 250b, wherein the stacked first conductive features 110b, 110d and 250b penetrate through the stacked first dielectric layers 110a, 110c and 250a. In some embodiments, the first bonding structure BS1 includes a hybrid bonding interface including dielectric-to-dielectric bonding interface (i.e. dielectric-to-dielectric bonding interface between the first dielectric layers 110c and 250a) and metal-to-metal bonding interface (i.e. metal-to-metal bonding interface between the first conductive features 110d and 250b).

After the reconstructed wafer W1 is bonded to the support wafer 100 through the first bonding structure BS1, the bottom semiconductor dies 200a are capable of electrically connecting to the doped regions 102 of the support wafer 100 through the first conductive features 110b, 110d and 250b in the first bonding structure BS.

In some embodiments, the support substrate 100 is not placed on a grounded wafer stage before bonding the reconstructed wafer W1 to the support wafer 100. In some alternative embodiments, before bonding the reconstructed wafer W1 to the support wafer 100, the support wafer 100 is grounded. For example, the support wafer 100 is placed on a grounded wafer stage, and the doped regions 102 of the support wafer 100 is grounded through the grounded wafer stage.

Figure 4B:
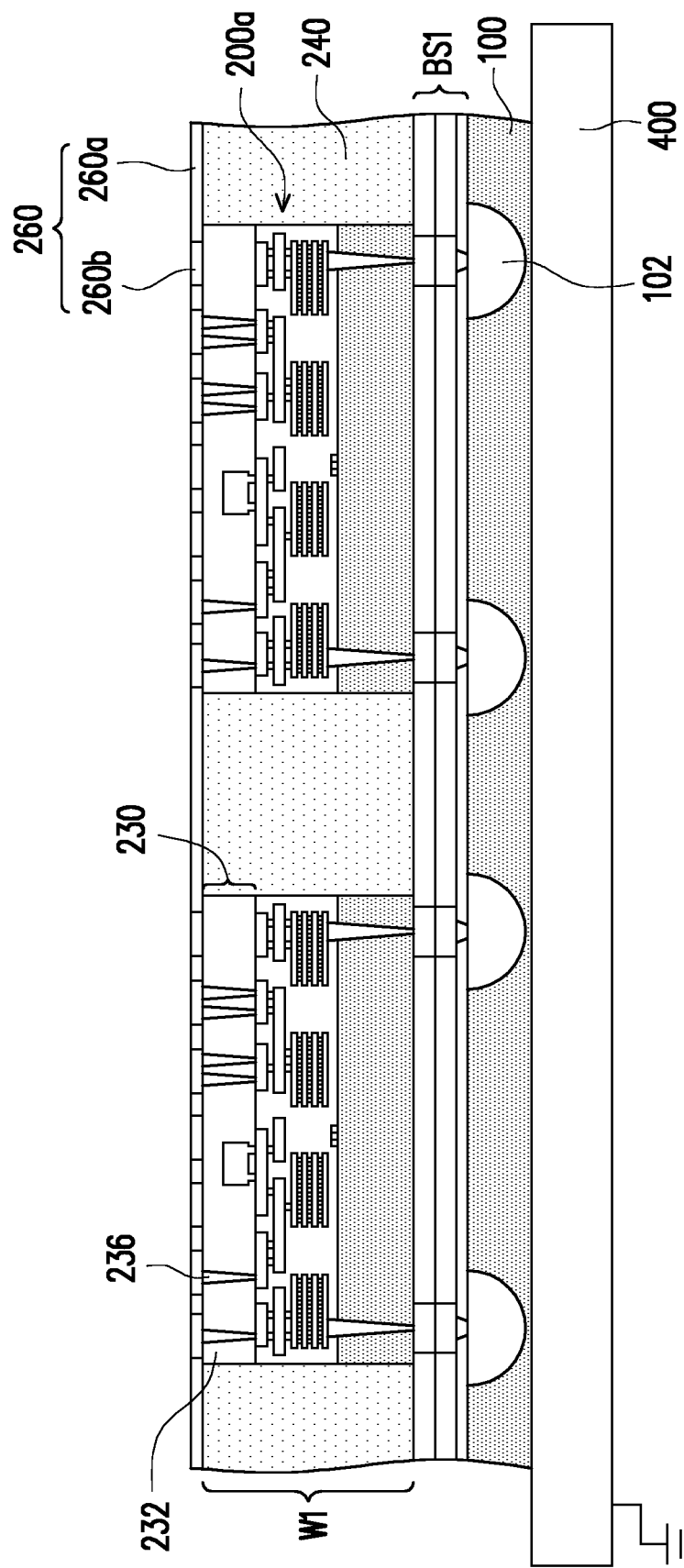

Referring to FIG. 4B, after bonding the reconstructed wafer W1 to the support wafer 100, the bonded structure of the reconstructed wafer W1 and the support wafer 100 is placed on and assembled with a grounded wafer stage 400 such that the reconstructed wafer W1 and the support wafer 100 are capable grounded through the grounded wafer stage 400. For example, the reconstructed wafer W1 is grounded through the bonding structure BS1, the doped regions 102 of the support wafer 100, and the grounded wafer stage 400. In some embodiments, the grounded wafer stage 400 is used to handle the bonded structure of the reconstructed wafer W1 and the support wafer 100 in wafer form to proceed subsequently performed processes (e.g., deposition, CMP, photolithography, etch, plating, ball mount processes, and so on).

Referring to FIG. 4A and FIG. 4B, after bonding the reconstructed wafer W1 to the support wafer 100, a de-bonding process is performed such that the reconstructed wafer W1 is de-bonded from the bonding layer B carried by the carrier C. In some embodiments, the de-bonding process is a laser lift-off process, a laser ablation process or the like.

After the reconstructed wafer W1 is de-bonded from the bonding layer B, the bonding layers 234 covering the bottom semiconductor dies 200*a* are removed. The bonding layers 234 may be removed through a grinding process (e.g., a mechanical grinding process and/or a CMP process) or other suitable removal processes. In an embodiment where the bonding layers 234 are removed by a CMP process, the bonding layers 234 and portions of the insulating encapsulation 240 are polished until the planarization layer 232 are revealed.

Conductive vias 236 electrically connected to the interconnect structure 220 may be formed in the planarization layer 232. In some embodiments, through via holes are formed in the planarization layer 232 by, for example, photolithography and etch processes. A conductive material is deposited over the planarization layer 232 and the insulating encapsulation 240 to fill the through via holes. A removal process may be performed to partially remove the deposited conductive material until the planarization layer 232 and the insulating encapsulation 240 are exposed such that the conductive vias 236 are formed in the planarization layer 232. The deposited conductive material for forming the conductive vias 236 may be partially removed by an etching process, a mechanical grinding process, a CMP process, or other suitable removal processes, or combinations thereof. For example, a seed layer is formed over the reconstructed wafer W1 through a sputter process, a conductive material is formed over the seed layer through an electro-plating process, and a CMP process is then performed to remove the conductive material and the seed layer outside the through via holes to form the conductive vias 236. The material of the conductive vias 236 may include copper (Cu) or other suitable metallic materials.

After forming the conductive vias 236 in the planarization layer 232, a bottom bonding portion 260 including a bottom dielectric layer 260*a* and bottom conductive features 260*b* penetrating through the bottom dielectric layer 260*a* is formed over the reconstructed wafer W1. Although one bottom dielectric layer 260*a* is illustrated and included in the bottom bonding portion 260, the number of dielectric layer and conductive features included in the bottom bonding portion 260 is not limited in the disclosure. The material of the bottom dielectric layer 260*a* may include silicon oxide ($SiO_x$, where x>0), silicon nitride ($SiN_x$, where x>0), silicon oxynitirde ($SiO_xN_y$, where x>0 and y>0) or other suitable dielectric materials. The material of the bottom conductive features 260*b* may include copper (Cu) or other suitable metallic materials. As illustrated in FIG. 4B, a top surface of the bottom dielectric layer 260*a* may be substantially coplanar with top surfaces of the bottom conductive features 260*b*.

A dielectric material is deposited over the surface of the reconstructed wafer W1 and patterned by, for example, photolithography and etch processes such that the bottom dielectric layer 260*a* including openings defined therein is formed over the reconstructed wafer W1. The dielectric material may be formed by physical vapor deposition (PVD), chemical vapor deposition (CVD) or other suitable processes. A conductive material is then deposited over the reconstructed wafer W1 to cover the bottom dielectric layer 260*a* and fill the openings defined in the bottom dielectric layer 260*a*. Portions of the conductive material which fill the openings are in contact with the conductive vias 236 formed in the bottom semiconductor dies 200*a*. The conductive material may be formed by physical vapor deposition (PVD), chemical vapor deposition (CVD) or other suitable processes. A removal process may be performed to partially remove the deposited conductive material until the bottom dielectric layer 260*a* is exposed such that the bottom conductive features 260*b* embedded in and penetrating through the bottom dielectric layer 260*a* are formed over the reconstructed wafer W1. The deposited conductive material for forming the bottom conductive features 260*b* may be partially removed by an etching process, a mechanical grinding process, a CMP process, or other suitable removal processes, or combinations thereof. In some embodiments, a seed layer is formed over the reconstructed wafer W1 and the bottom dielectric layer 260*a* through a sputter process, a conductive material is formed over the seed layer through an electro-plating process, and a CMP process is then performed to remove the conductive material and the seed layer outside the openings of the bottom dielectric layer 260*a* to form the bottom conductive features 260*b*.

In an embodiment where a CMP process is utilized to form the bottom conductive features 260*b*, metal corrosion issue of the bottom conductive features 260*b* resulted from chemicals (e.g. a CMP slurry) used in the CMP process may be improved because the reconstructed wafer W1 and the support wafer 100 are grounded through the grounded wafer stage 400.

Figure 4C:
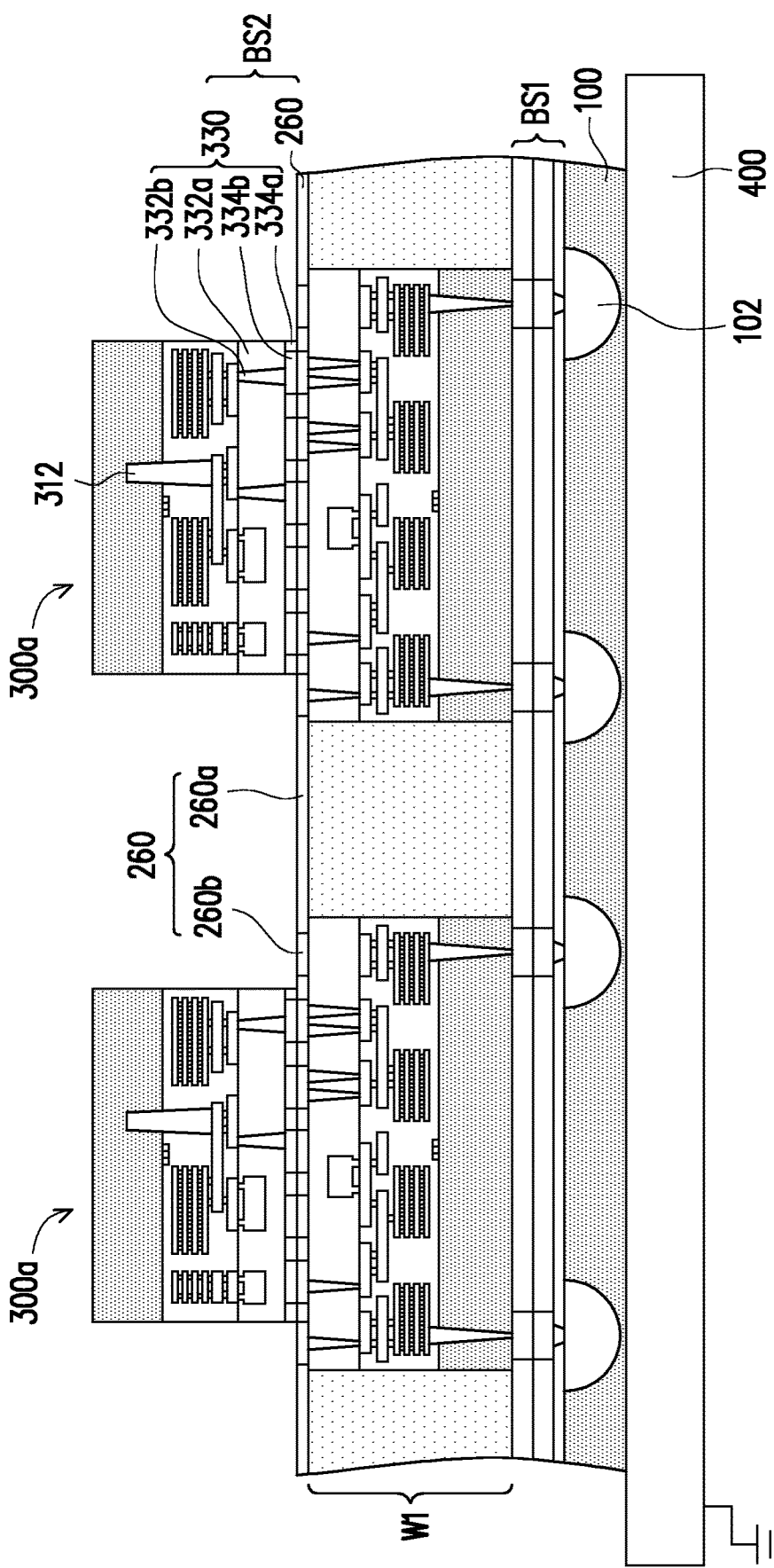

Referring to FIG. 4C, multiple top semiconductor dies 300*a* are provided and bonded to the bottom bonding portion 260 formed on the reconstructed wafer W1. The top semiconductor dies 300*a* each including an upper bonding portion 330 may be flipped over and pressed onto the bottom bonding portion 260 formed on the reconstructed wafer W1 such that the upper bonding portion 330 is in contact with the bottom bonding portion 260. A wafer-to-wafer bonding process (e.g., a wafer-to-wafer hybrid bonding process including dielectric-to-dielectric bonding and metal-to-metal bonding) is performed to bond the top semiconductor dies 300*a* to the reconstructed wafer W1 through a second bonding structure BS2 including the bottom bonding portion 260 and the upper bonding portion 330. As illustrated in FIG. 4A, the second bonding structure BS2 includes stacked second dielectric layers 260*a* and 334*a* and stacked second conductive features 260*b* and 334*b*, wherein the stacked second conductive features 260*b* and 334*b* penetrate through the stacked second dielectric layers 260*a* and 334*a*. In some embodiments, the second bonding structure BS2 includes a hybrid bonding interface including dielectric-to-dielectric bonding interface (i.e. dielectric-to-dielectric bonding interface between the second dielectric layers 260a and 334a) and metal-to-metal bonding interface (i.e. metal-to-metal bonding interface between the second conductive features 260b and 334b).

After the top semiconductor dies 300a are bonded to the reconstructed wafer W1 through the second bonding structure BS2, the top semiconductor dies 300a and the bottom semiconductor dies 200a in the reconstructed wafer W1 are electrically connected through the stacked second conductive features 260b and 334b in the second bonding structure BS2. The bonded structure of the bottom semiconductor dies 200a and the top semiconductor dies 300a may be referred as to an SoIC chip. Furthermore, the top semiconductor dies 300a are grounded to the grounded wafer stage 400 through the second bonding structure BS2, the bottom semiconductor dies 200a, the first bonding structure BS1, and the doped regions 102 of the support substrate 100.

Figure 4D:
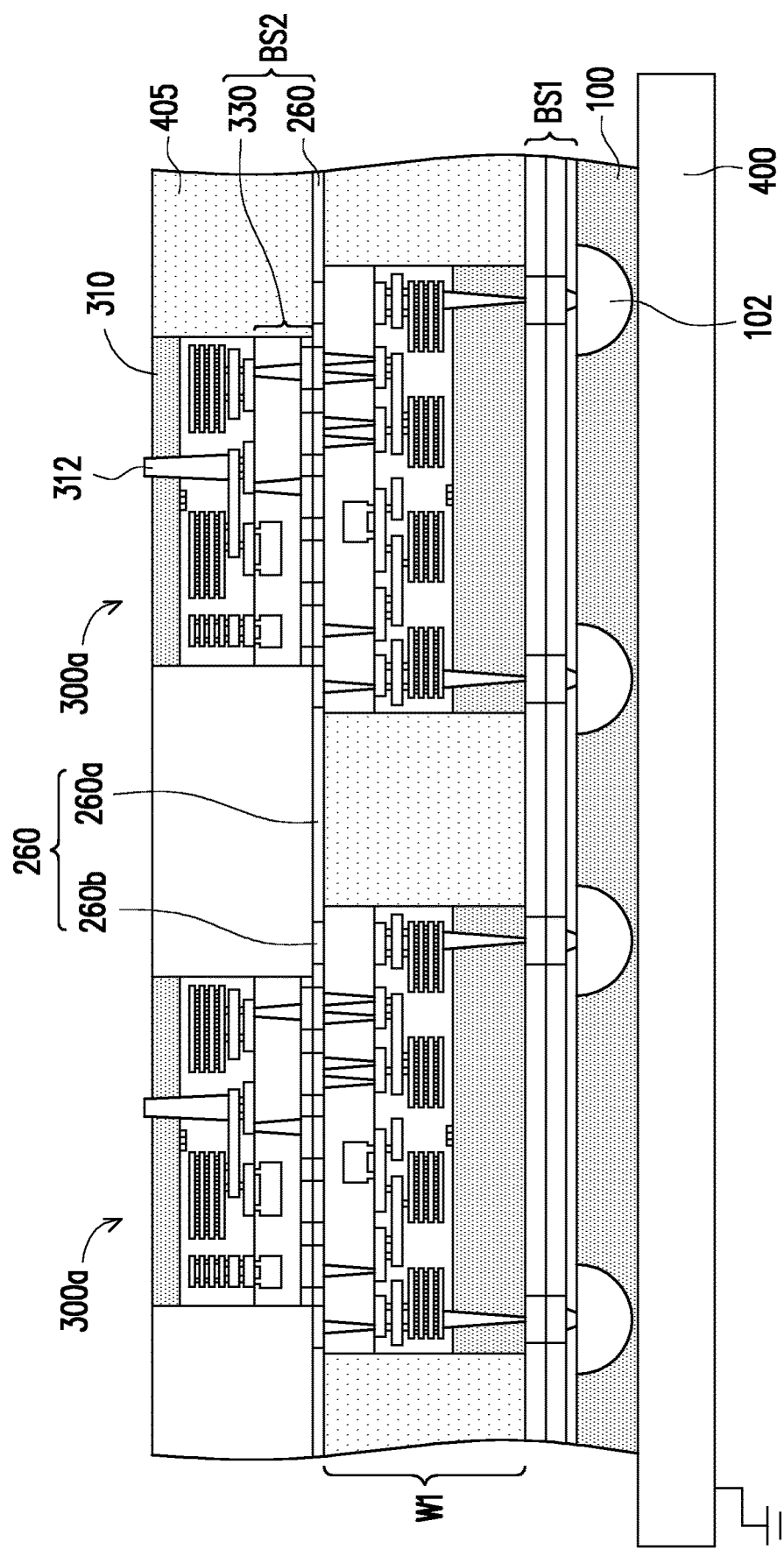

Referring to FIG. 4D, after the top semiconductor dies 300a are bonded to the reconstructed wafer W1, an insulating encapsulation 405 is formed over the reconstructed wafer W1 to laterally encapsulate the top semiconductor dies 300a. The insulating encapsulation 405 may be formed by an over-molding or deposition process followed by a grinding process. In some embodiments, the material of the insulating encapsulation 405 includes deposited polyimide, deposited oxide, deposited nitride, or other suitable deposited dielectric material. In some alternative embodiments, the material of the insulating encapsulation 405 includes epoxy or other suitable molding compound. In some embodiments, an insulating material is formed over the bottom bonding portion 260 through an over-mold process or a deposition process to cover side surfaces and bottom surfaces of the top semiconductor dies 300a, and the insulating material is then polished by, for example, a mechanical grinding process and/or a CMP process such that the insulating encapsulation 405 are formed and the bottom surfaces of the top semiconductor dies 300a are revealed. During the grinding process of the insulating material, the semiconductor substrates 310 of the top semiconductor dies 300a are polished and thinned down such that bottom surfaces of the TSVs 312 are revealed. In some embodiments, the TSVs 312 may slightly protrude from the bottom surfaces of the top semiconductor dies 300a. In some alternative embodiments, not illustrated in FIG. 4D, the bottom surfaces the TSVs 312 may be substantially coplanar with the bottom surfaces of the top semiconductor dies 300a.

In an embodiment where a CMP process is utilized to reveal the TSVs 312, metal corrosion issue of the TSVs 312 resulted from chemicals (e.g. a CMP slurry) used in the CMP process may be improved because the top semiconductor dies 300a, the reconstructed wafer W1 and the support wafer 100 are grounded through the grounded wafer stage 400.

As illustrated in FIG. 4D, after performing the grinding process of the insulating material, multiple upper tier package structures are formed over the bottom tier package structures in the reconstructed wafer W1. The upper tier package structures may include the top semiconductor dies 300a arranged in array and the insulating encapsulation 405 laterally encapsulating the top semiconductor dies 300a.

Figure 4E:
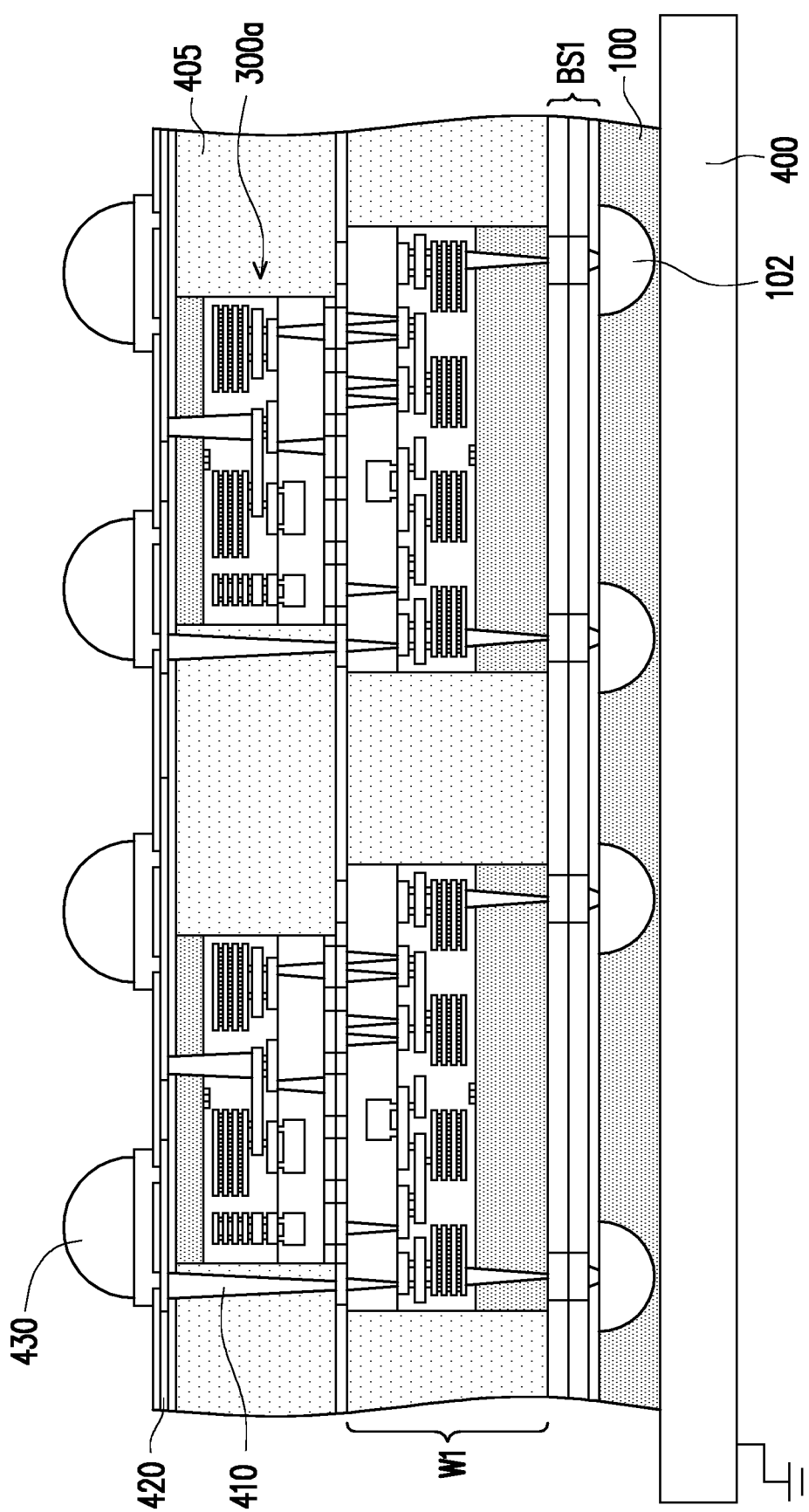

As illustrated in FIG. 4D and FIG. 4E, conductive through vias 410 may be formed in the insulating encapsulation 405. In some embodiments, through via holes are formed in the insulating encapsulation 405 by, for example, photolithography and etch processes. A conductive material is deposited over the insulating encapsulation 405 and the insulating encapsulation 405 to fill the through via holes. A removal process may be performed to partially remove the deposited conductive material until the insulating encapsulation 405 and the insulating encapsulation 405 are exposed such that the conductive through vias 410 are formed in the insulating encapsulation 405. The deposited conductive material for forming the conductive through vias 410 may be partially removed by an etching process, a mechanical grinding process, a CMP process, or other suitable removal processes, or combinations thereof. For example, a seed layer is formed over the top semiconductor dies 300a and the insulating encapsulation 405 through a sputter process, a conductive material is formed over the seed layer through an electroplating process, and a CMP process is then performed to remove the conductive material and the seed layer outside the through via holes to form the conductive through vias 410. The material of the conductive through vias 410 may include copper (Cu) or other suitable metallic materials.

Figure 4F:
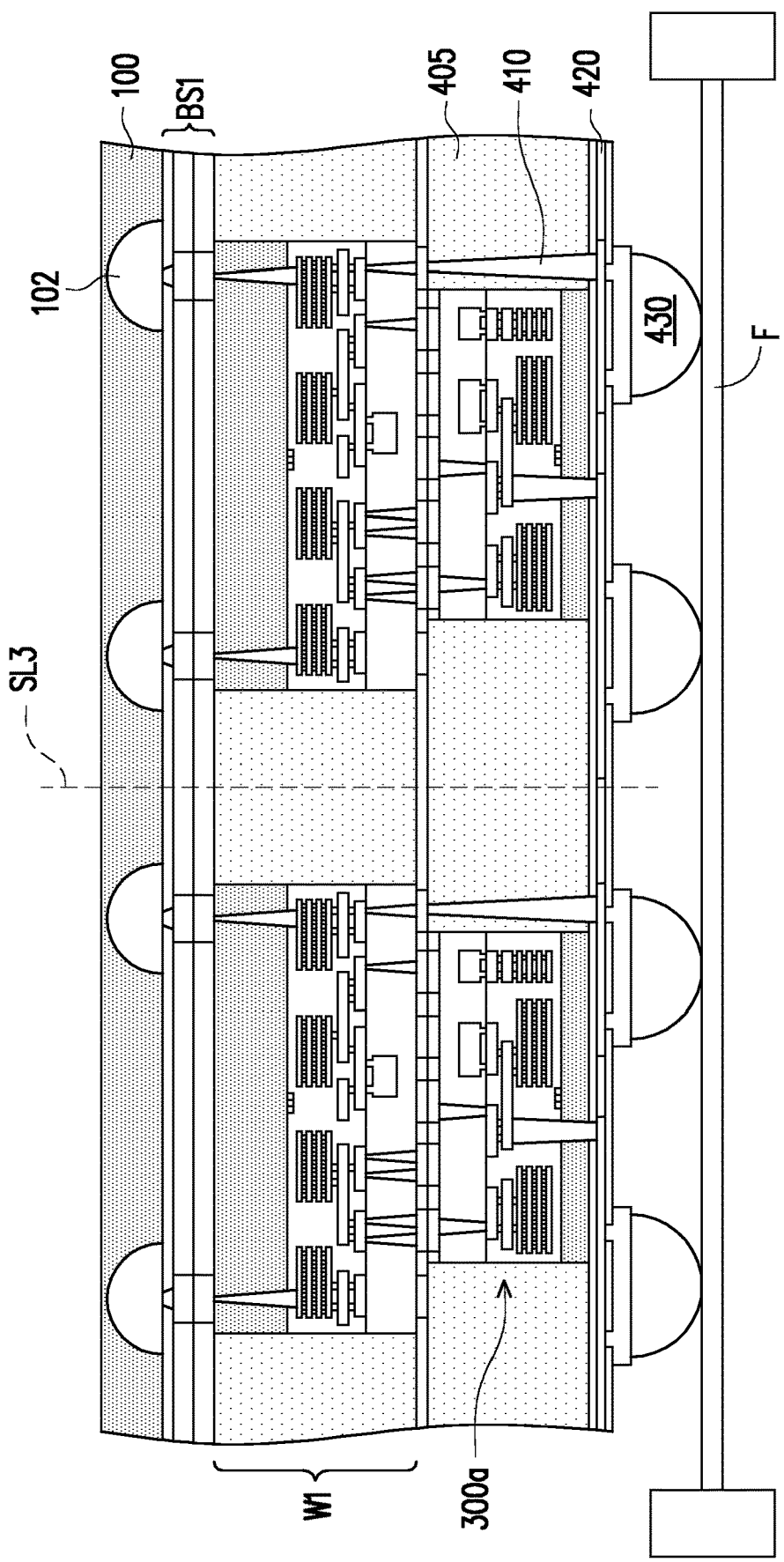

Referring to FIG. 4E and FIG. 4F, a redistribution circuit layer 420 and electrical terminals 430 may be formed over the top semiconductor dies 300a and the insulating encapsulant 405. After the redistribution circuit layer 420 and electrical terminals 430 are formed, the wafer-level package including the support wafer 100, the first bonding structure BS1, the reconstructed wafer W1, the second bonding structure BS2, the top semiconductor dies 300a, the insulating encapsulant 405, the redistribution circuit layer 420 and the electrical terminals 430 is subjected to a frame mount process to transfer the resulted structure illustrated in FIG. 4E onto a frame F. In some embodiments, the electrical terminals 430 of the resulted structure are mounted on the frame F. In some alternative embodiments, not illustrated in figures, the support wafer 100 of the resulted structure are mounted on the frame F.

Figure 4G:
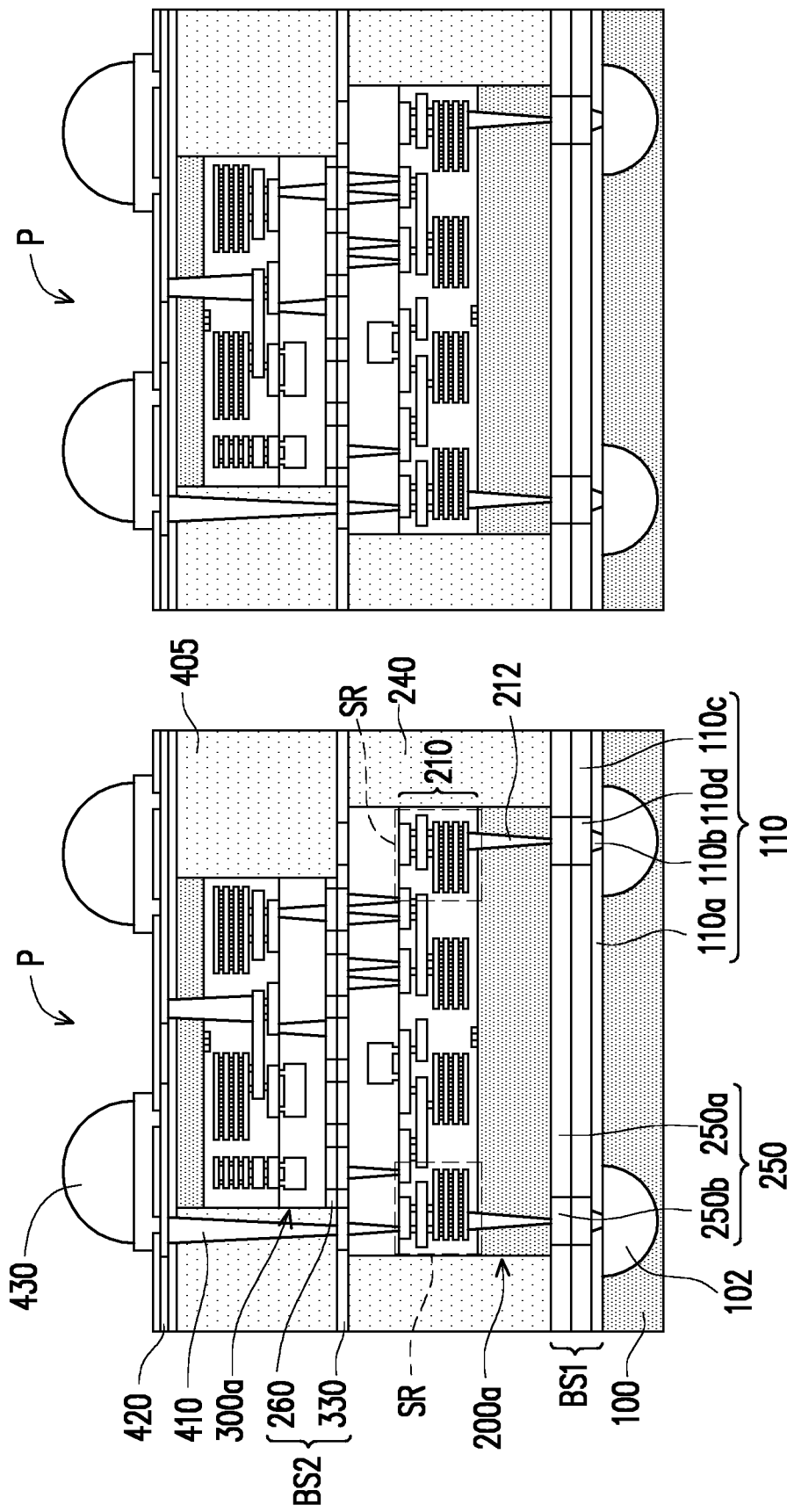

As illustrated in FIG. 4F and FIG. 4G, a wafer dicing process is performed along the scribe line SL3 to singulate the structure mounted on the frame F into multiple singulated SoIC package P. The detailed structure of the singulated SoIC package P will be described in accompany with FIG. 4G.

As illustrated in FIG. 4G, the SoIC package P may include a support substrate 100, a first bonding structure BS1, a bottom tier package structure including a bottom semiconductor die 200a and an insulating encapsulant 240, a second bonding structure BS2, an upper tier package including a top semiconductor die 300a and an insulating encapsulant 405, a redistribution circuit layer 420 disposed over and electrically connected to the upper tier package structure, and electrical terminals 430 disposed over the redistribution circuit layer 420 and electrically connected to the upper tier package structure through the redistribution circuit layer 420.

In the singulated SoIC package P, the support substrate 100 may include doped regions 102 distributed therein. The first bonding structure BS1 of the SoIC package P may include the bottom bonding portion 110 and the upper bonding portion 250. The first bonding structure BS1 may include stacked first dielectric layers 110a, 110c and 250a and stacked first conductive features 110b, 110d and 250b, and the stacked first conductive features 110b, 110d and 250b penetrate through the stacked first dielectric layers 110a, 110c and 250a. The first bonding structure BS1 in the SoIC package P may include a hybrid bonding interface including dielectric-to-dielectric bonding interface (i.e. dielectric-to-dielectric bonding interface between the first dielectric layers 110c and 250a) and metal-to-metal bonding interface (i.e. metal-to-metal bonding interface between the first conductive features 110*d* and 250*b*). Furthermore, the second bonding structure BS2 of the SoIC package P may include the bottom bonding portion 330 and the upper bonding portion 260. The detailed description of the second bonding structure BS2 is illustrated in FIG. 4C.

Figure 5:
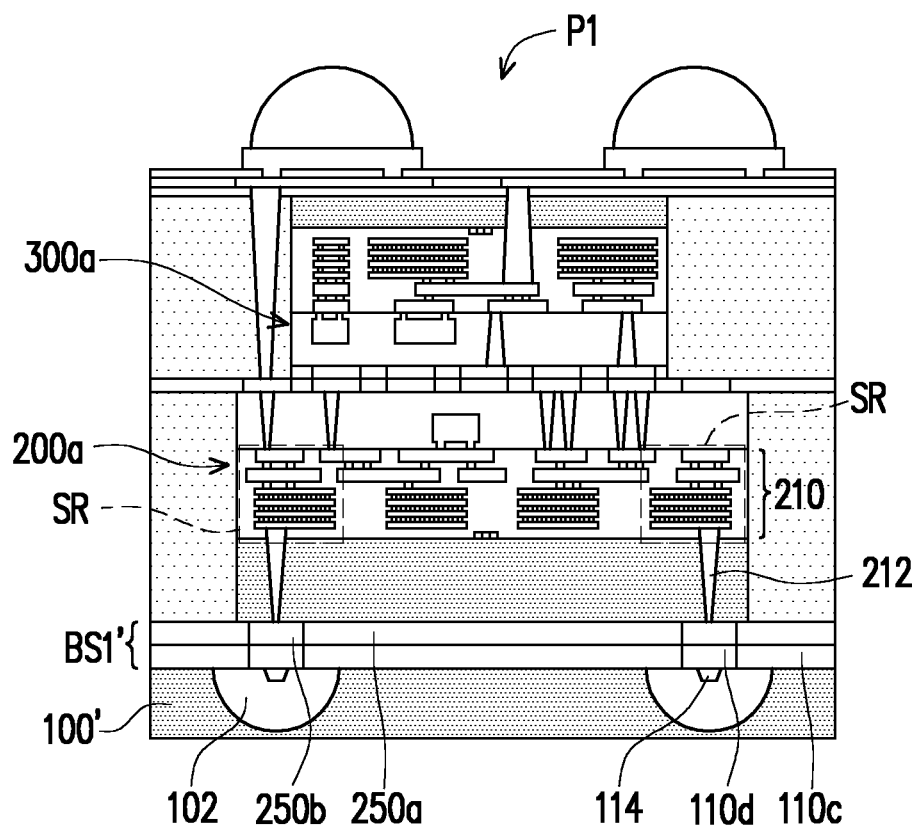
FIG. 5 is a cross-sectional view schematically illustrating a package structure of system on an SoIC chip in accordance with other embodiments of the present disclosure.
Figure 6:
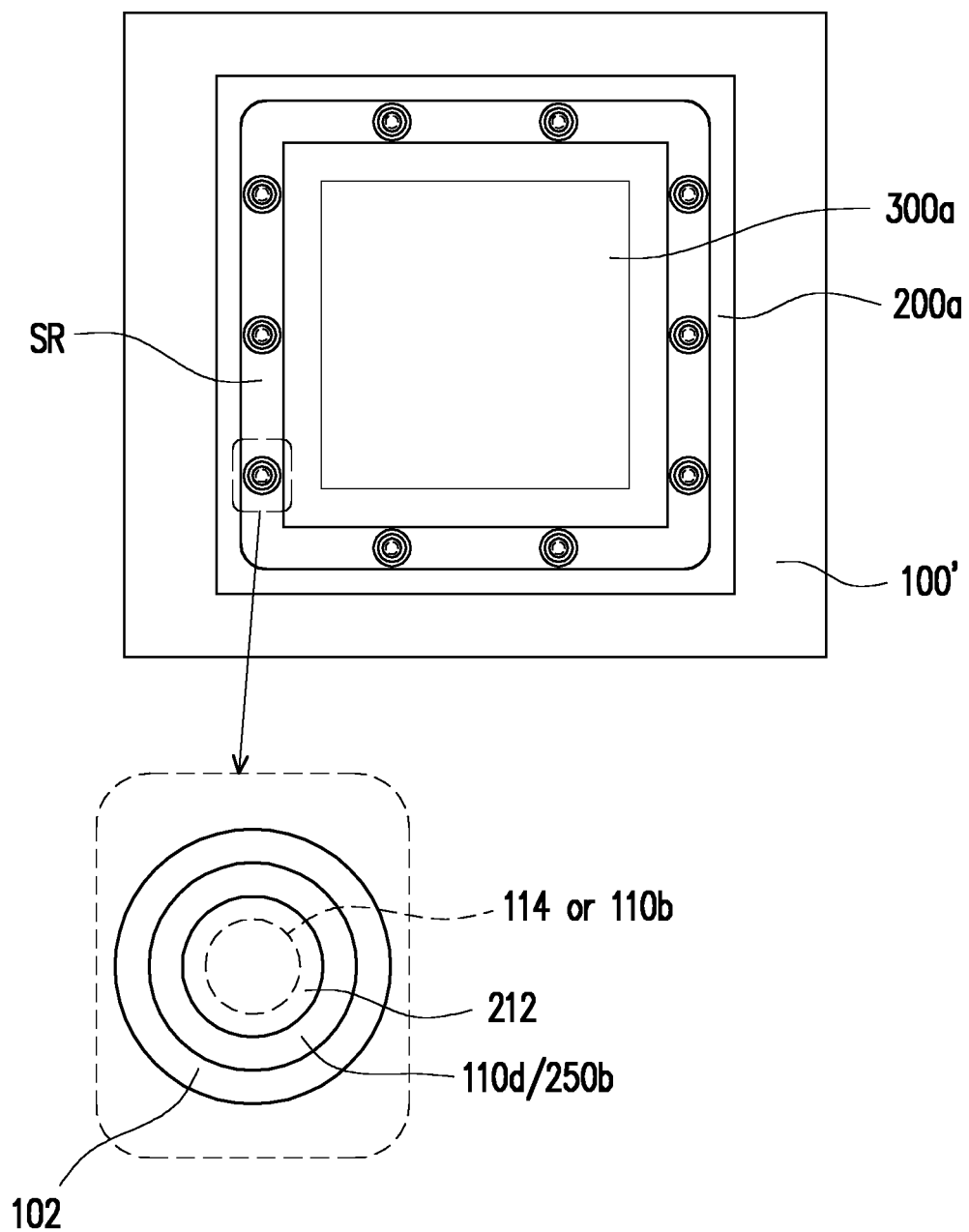
FIG. 6 is a view schematically illustrating the support substrate, the bottom semiconductor die, the top semiconductor die, the seal ring, and the conductive features illustrated in FIG. 5, in accordance with other embodiments of the present disclosure.

FIG. 5 is a cross-sectional view schematically illustrating a package structure of system on an SoIC chip in accordance with other embodiments of the present disclosure. FIG. 6 is a view schematically illustrating the support substrate, the bottom semiconductor die, the top semiconductor die, the seal ring, and the conductive features illustrated in FIG. 5, in accordance with other embodiments of the present disclosure.

Referring to FIG. 4G and FIG. 5, the SoIC chip package P1 illustrated in FIG. 5 is similar with the SoIC chip package P illustrated in FIG. 4G except for the support substrate 100' and the first bonding structure BS1' of the SoIC chip package P1. The first bonding structure BS1' of the SoIC chip package P1 may include a bottom dielectric layer 110*c*, bottom conductive features 110*d*, an upper dielectric layer 250*a*, and upper conductive features 250*b*. Furthermore, the support substrate 100' may include doped regions 120 and conductive contacts 114 embedded in the doped regions 120, wherein the doped regions 120 and the conductive contacts 114 are in contact with the bottom conductive features 110*d*.

As illustrated in FIG. 4G and FIG. 5, in the SoIC chip package P and the SoIC chip package P1, the bottom semiconductor dies 200*a* may further include a seal ring SR distributed in the interconnect structure 210 thereof. As illustrated in FIG. 4G, the seal ring SR may be electrically connected to the doped regions 102 of the support substrate 100 through the TSVs 212, the upper conductive features 250*b* and the bottom conductive features 110*d* and 110*b*. As illustrated in FIG. 5, the seal ring SR may be electrically connected to the doped regions 102 of the support substrate 100 through the TSVs 212, the upper conductive features 250*b* and the bottom conductive features 110*d*, and the conductive contacts 114.

Referring to FIG. 4G, FIG. 5 and FIG. 6, the TSVs 212, the conductive features 250*b*, the conductive features 110*d*, the conductive features 110*b* illustrated in FIG. 4G, the conductive contacts 114 illustrated in FIG. 5, and the doped regions 102 are disposed under the seal ring SR. The conductive features 250*b*, the conductive features 110*d*, the conductive features 110*b* illustrated in FIG. 4G, the conductive contacts 114 illustrated in FIG. 5, and the doped regions 102 are arranged along a ring-shaped path under the seal ring SR.

Figure 7:
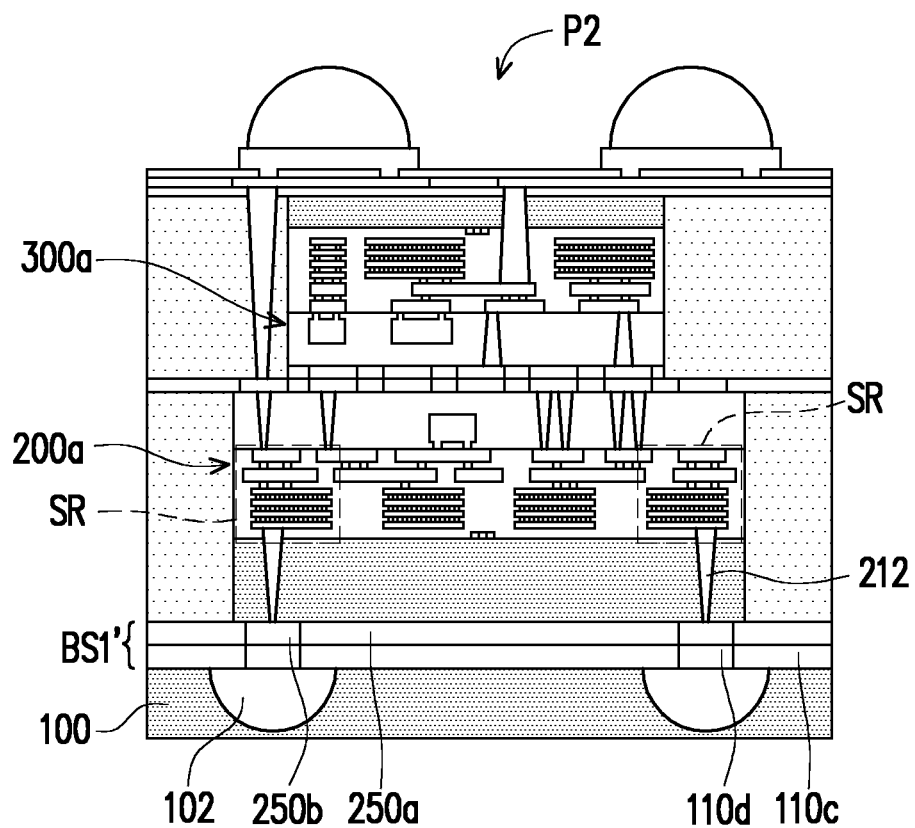
FIG. 7 is a cross-sectional view schematically illustrating a package structure of system on an SoIC chip in accordance with still other embodiments of the present disclosure.
Figure 8:
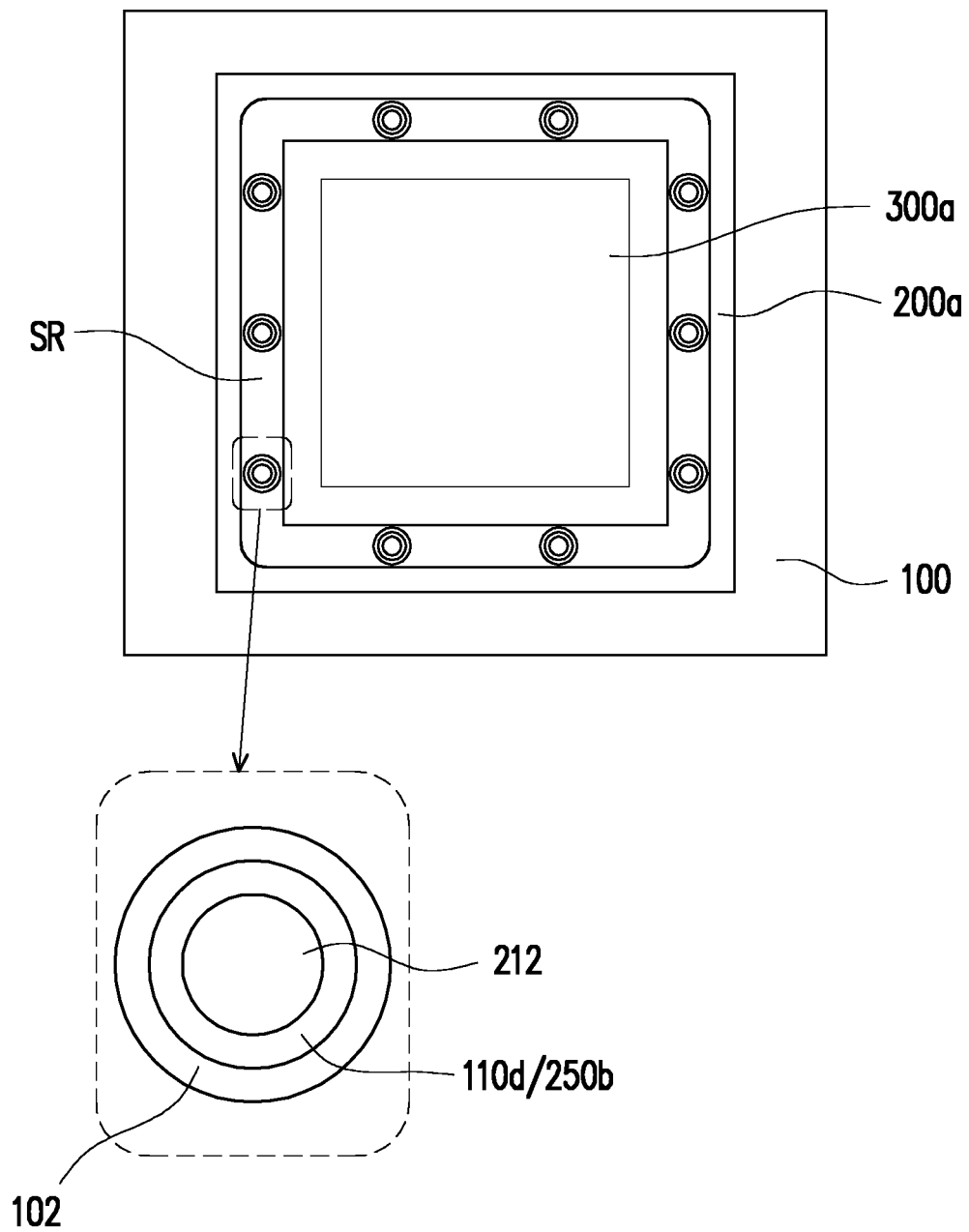
FIG. 8 is a view schematically illustrating the support substrate, the bottom semiconductor die, the top semiconductor die, the seal ring, and the conductive features illustrated in FIG. 7, in accordance with other embodiments of the present disclosure.

FIG. 7 is a cross-sectional view schematically illustrating a package structure of system on an SoIC chip in accordance with still other embodiments of the present disclosure. FIG. 8 is a view schematically illustrating the support substrate, the bottom semiconductor die, the top semiconductor die, the seal ring, and the conductive features illustrated in FIG. 7, in accordance with other embodiments of the present disclosure.

Referring to FIG. 7 and FIG. 8, the SoIC chip package P2 illustrated in FIG. 7 and FIG. 8 is similar with the SoIC chip package P1 illustrated in FIG. 5 except for the support substrate 100 of the SoIC chip package P2. The support substrate 100 does not include embedded conductive contacts 114 (illustrated in FIG. 5).

Figure 9:
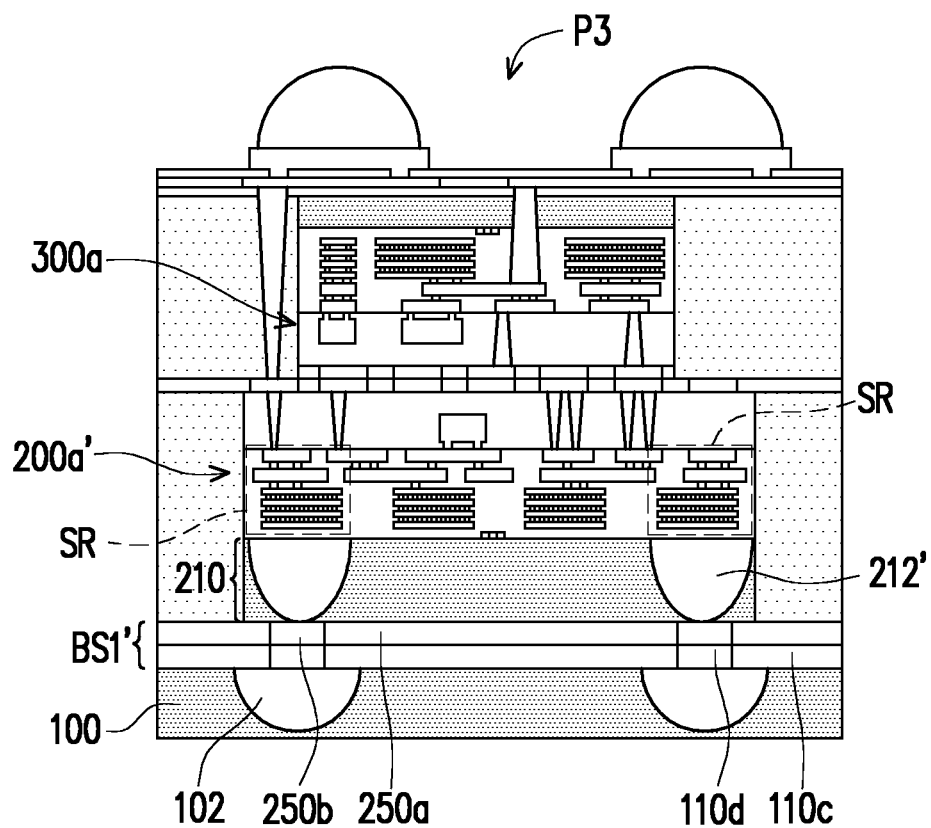
FIG. 9 is a cross-sectional view schematically illustrating a package structure of system on an SoIC chip in accordance with some alternative embodiments of the present disclosure.
Figure 10:
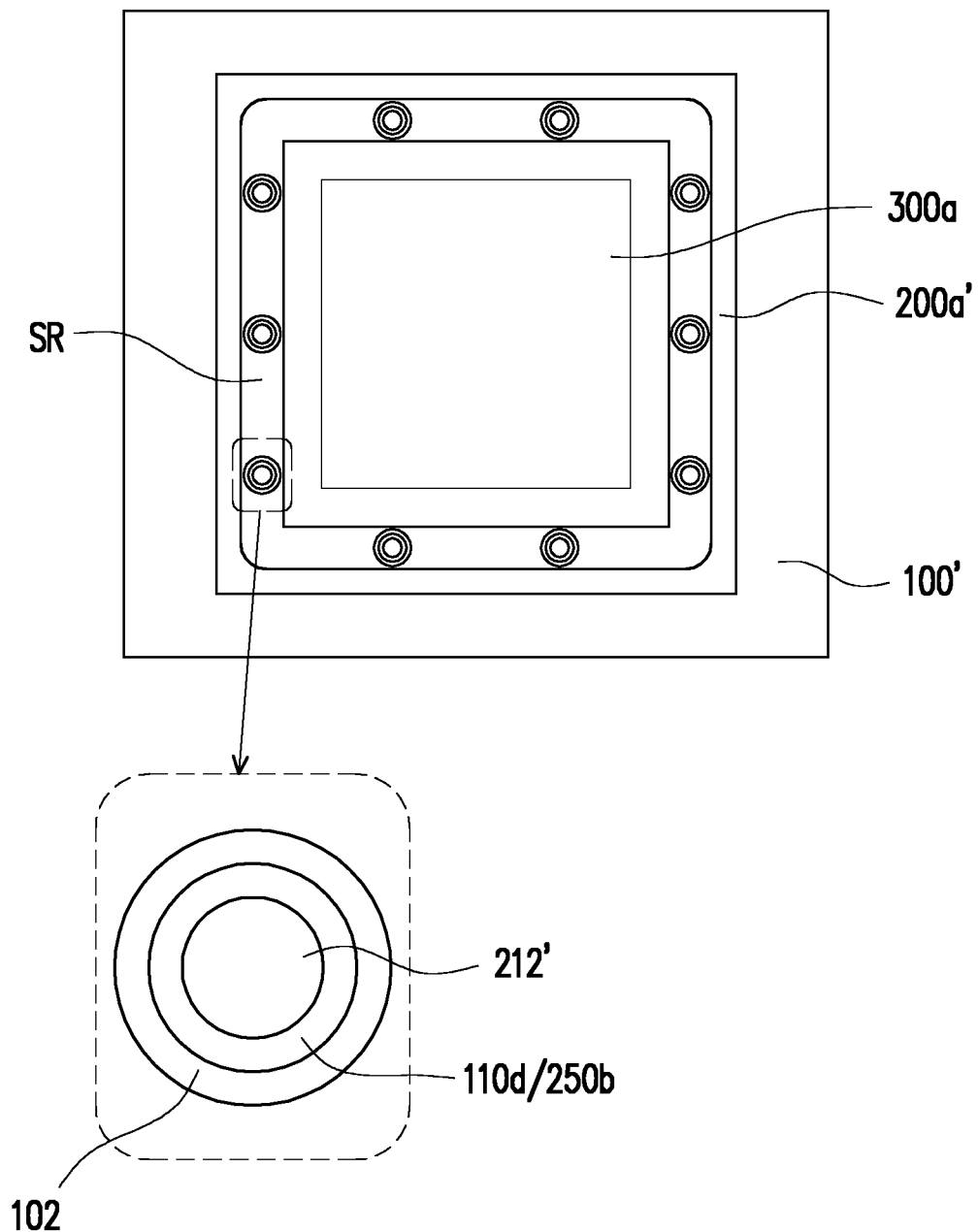
FIG. 10 is a view schematically illustrating the support substrate, the bottom semiconductor die, the top semiconductor die, the seal ring, and the conductive features illustrated in FIG. 9, in accordance with other embodiments of the present disclosure.

FIG. 9 is a cross-sectional view schematically illustrating a package structure of system on an SoIC chip in accordance with some alternative embodiments of the present disclosure. FIG. 10 is a view schematically illustrating the support substrate, the bottom semiconductor die, the top semiconductor die, the seal ring, and the conductive features illustrated in FIG. 9, in accordance with other embodiments of the present disclosure.

Referring to FIG. 9 and FIG. 10, the SoIC chip package P3 illustrated in FIG. 9 and FIG. 10 is similar with the SoIC chip package P2 illustrated in FIG. 7 and FIG. 8 except for the bottom semiconductor die 200*a*' in the SoIC chip package P3. The bottom semiconductor die 200*a*' includes doped regions 212' formed in the semiconductor substrate 210, wherein the doped regions 212' are formed under the seal ring SR. In some embodiments, the doped regions 212' include n-type doped regions, p-type doped regions or combinations thereof. The doping concentration of the doped regions 212' may range from about 1E9 cm-3 to about 1E16 cm-3.

In the above-mentioned embodiments, the SoIC chip packages may be fabricated over a support substrate or a support wafer which is mounted on a grounded stage. Since the SoIC chip packages are fabricated over grounded support substrate or grounded support wafer, metal corrosion issue of the conductive features resulted from chemicals (e.g. a CMP slurry) used in the CMP process may be improved. Accordingly, yield rate of the SoIC chip packages may increase.

In accordance with some embodiments of the disclosure, a method including the followings is provided. A bottom tier package structure is bonded to a support substrate through a first bonding structure disposed between the bottom tier package structure and the support substrate, wherein the bottom tier package structure includes a first semiconductor die encapsulated by a first insulating encapsulation, and the first bonding structure includes stacked first dielectric layers and at least one stacked first conductive features penetrating through the stacked first dielectric layers. The support substrate is placed on a grounded stage such that the first semiconductor die is grounded through the at least one first stacked conductive features, the support substrate and the grounded stage. A second semiconductor die is bonded to the bottom tier package structure through a second bonding structure between the second semiconductor die and the bottom tier package structure, wherein the second bonding structure includes stacked second dielectric layers and at least one stacked second conductive features penetrating through the stacked second dielectric layers. The second semiconductor die is encapsulated with a second insulating encapsulation to form an upper tier package structure over the bottom tier package structure.

In accordance with some embodiments of the disclosure, a method including the followings is provided. A reconstructed wafer including bottom tier package structures is bonded to a support wafer through a first bonding structure disposed between the reconstructed wafer and the support wafer, wherein each of the bottom tier package structures respectively comprises a first semiconductor die encapsulated by a first insulating encapsulation, and the first bonding structure comprises stacked first dielectric layers and stacked first conductive features penetrating through the stacked first dielectric layers. The support wafer is placed on a grounded wafer stage such that the first semiconductor die is grounded through the first stacked conductive features, the support wafer and the grounded wafer stage. Second semiconductor dies are bonded to the bottom tier package structures of the reconstructed wafer through a second bonding structure between the second semiconductor dies and the reconstructed wafer, wherein the second bonding structure includes stacked second dielectric layers and stacked second conductive features penetrating through the stacked second dielectric layers. The second semiconductor dies are encapsulated with a second insulating encapsulation to form upper tier package structures over the bottom tier package structures of the reconstructed wafer.

In accordance with some embodiments of the disclosure, a structure including a support substrate, a package, and a bonding structure is provided. The support substrate includes a doped region distributed therein. The package includes a first semiconductor die and a second semiconductor die stacked over the first semiconductor die. The bonding structure is disposed between the support substrate and the package, wherein the first semiconductor die is electrically connected to the doped region through at least one conductive feature of the bonding structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   bonding a first package structure to a support substrate through a wafer-to-wafer bonding process, wherein the first package structure comprises a first semiconductor die encapsulated by a first insulating encapsulation;
   placing the support substrate on a grounded stage such that the first semiconductor die is grounded through the support substrate and the grounded stage;
   after the first semiconductor die is grounded through the support substrate and the grounded stage, bonding a second semiconductor die to the first package structure; and
   encapsulating the second semiconductor die with a second insulating encapsulation to form a second package structure over the first package structure.

2. The method as claimed in claim 1, wherein the support substrate is placed on the grounded stage after bonding the first package structure to the support substrate.

3. The method as claimed in claim 1, wherein the support substrate is placed on the grounded stage before bonding the first package structure to the support substrate.

4. The method as claimed in claim 1, wherein bonding the first package structure to the support substrate comprises:
   forming a first bonding portion of a first bonding structure over the support substrate, wherein the first bonding portion of the first bonding structure comprises at least one first dielectric layer and at least one first conductive feature, and the at least one first conductive feature penetrates through the at least one first dielectric layer;
   forming a second bonding portion of the first bonding structure over the first package structure, wherein the second bonding portion of the first bonding structure comprises a second dielectric layer and at least one second conductive feature, and the at least one second conductive feature penetrates through the second dielectric layer; and
   bonding the second bonding portion to the first bonding portion.

5. The method as claimed in claim 1, wherein bonding the second semiconductor die to the first package structure comprises:
   forming a first bonding portion of a second bonding structure over the first package structure, wherein the first bonding portion of the second bonding structure comprises a first dielectric layer and at least one first conductive feature, and the at least one first conductive feature penetrates through the first dielectric layer;
   forming a second bonding portion of the second bonding structure over the second semiconductor die, wherein the second bonding portion of the second bonding structure comprises a second dielectric layer and at least one second conductive feature, and the at least one second conductive feature penetrates through the second dielectric layer; and
   bonding the second bonding portion to a portion of the first bonding portion.

6. The method as claimed in claim 5, wherein the second insulating encapsulation is formed to cover the first bonding portion of the second bonding structure.

7. The method as claimed in claim 5, wherein processes for forming the first bonding portion of the second bonding structure comprises:
   forming the first dielectric layer over the first package structure;
   forming a conductive material over the first package structure to cover the first dielectric layer; and
   by a chemical mechanical polishing process, partially removing the conductive material to expose the first dielectric layer to form the at least one first conductive feature.

8. A method, comprising:
   bonding a reconstructed wafer comprising a plurality of bottom tier package structures to a support wafer, wherein each of the plurality of bottom tier package structures respectively comprises a first semiconductor die encapsulated by a first insulating encapsulation;
   placing the support wafer on a grounded wafer stage such that the first semiconductor die is grounded through the support wafer and the grounded wafer stage;
   bonding a plurality of second semiconductor dies to the plurality of bottom tier package structures of the reconstructed wafer; and
   encapsulating the plurality of second semiconductor dies with a second insulating encapsulation to form a plurality of upper tier package structures over the plurality of bottom tier package structures of the reconstructed wafer.

9. The method as claimed in claim 8, wherein the support wafer is placed on the grounded wafer stage after bonding the reconstructed wafer to the support wafer.

10. The method as claimed in claim 8, wherein the support wafer is placed on the grounded wafer stage before bonding the reconstructed wafer to the support wafer.

11. The method as claimed in claim 8, wherein bonding the reconstructed wafer to the support wafer comprises:
   forming a bottom bonding portion of a first bonding structure over the support wafer, wherein the bottom bonding portion of the first bonding structure comprises at least one bottom dielectric layer and a plurality of bottom conductive features, and the plurality of bottom conductive features penetrate through the at least one bottom dielectric layer;
   forming an upper bonding portion of the first bonding structure over the reconstructed wafer, wherein the upper bonding portion of the first bonding structure comprises an upper dielectric layer and a plurality of upper conductive features, and the plurality of upper conductive features penetrate through the upper dielectric layer; and bonding the upper bonding portion to the bottom bonding portion.

12. The method as claimed in claim 11, wherein a wafer-to-wafer bonding process is performed to bond the upper bonding portion and the bottom bonding portion.

13. The method as claimed in claim 8, wherein bonding the plurality of second semiconductor dies to the reconstructed wafer comprises:

forming a bottom bonding portion of a second bonding structure over the reconstructed wafer, wherein the bottom bonding portion of the second bonding structure comprises a bottom dielectric layer and a plurality of bottom conductive features, and the plurality of bottom conductive features penetrate through the bottom dielectric layer;

forming an upper bonding portion of the second bonding structure over the plurality of second semiconductor dies, wherein the upper bonding portion of the second bonding structure comprises an upper dielectric layer and a plurality of upper conductive features, and the plurality of upper conductive features penetrate through the upper dielectric layer; and bonding the upper bonding portion to a portion of the bottom bonding portion.

14. The method as claimed in claim 13, wherein a chip-to-wafer bonding process is performed to bond the upper bonding portion and the bottom bonding portion.

15. The method as claimed in claim 13, wherein the second insulating encapsulation is formed to cover the bottom bonding portion of the second bonding structure.

16. The method as claimed in claim 13, wherein processes for forming the bottom bonding portion of the second bonding structure comprises:

forming the bottom dielectric layer over the bottom tier package structure of the reconstructed wafer;

forming a conductive material over the reconstructed wafer to cover the bottom dielectric layer; and by a chemical mechanical polishing process, partially removing the conductive material to expose the bottom dielectric layer to form the plurality of bottom conductive feature.

17. A method, comprising:

bonding a first package structure to a support substrate comprising doped regions, wherein the first package structure comprises a first semiconductor die encapsulated by a first insulating encapsulation;

electrically grounding the support substrate such that the first semiconductor die is electrically grounded through the doped regions of the support substrate;

after the first semiconductor die is grounded, bonding a second semiconductor die to the first package structure; and encapsulating the second semiconductor die with a second insulating encapsulation to form a second package structure over the first package structure.

18. The method as claimed in claim 17, wherein bonding the first package structure to the support substrate comprises:

forming a first bonding portion of a first bonding structure over the support substrate, wherein the first bonding portion of the first bonding structure comprises at least one first dielectric layer and at least one first conductive feature, and the at least one first conductive feature penetrates through the at least one first dielectric layer;

forming a second bonding portion of the first bonding structure over the first package structure, wherein the second bonding portion of the first bonding structure comprises a second dielectric layer and at least one second conductive feature, and the at least one second conductive feature penetrates through the second dielectric layer; and bonding the second bonding portion to the first bonding portion.

19. The method as claimed in claim 17 wherein bonding the second semiconductor die to the first package structure comprises:

forming a first bonding portion of a second bonding structure over the first package structure, wherein the first bonding portion of the second bonding structure comprises a first dielectric layer and at least one first conductive feature, and the at least one first conductive feature penetrates through the first dielectric layer;

forming a second bonding portion of the second bonding structure over the second semiconductor die, wherein the second bonding portion of the second bonding structure comprises a second dielectric layer and at least one second conductive feature, and the at least one second conductive feature penetrates through the second dielectric layer; and bonding the second bonding portion to a portion of the first bonding portion.

20. The method as claimed in claim 17, wherein the first package structure comprises a semiconductor wafer.

* * * * *